(12) United States Patent  (10) Patent No.: US 8,338,814 B2
Tsunoda  (45) Date of Patent: Dec. 25, 2012

(54) RESISTIVE RANDOM ACCESS MEMORY, NONVOLATILE MEMORY, AND METHOD OF MANUFACTURING RESISTIVE RANDOM ACCESS MEMORY

(75) Inventor: Koji Tsunoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 141 days.

(21) Appl. No.: 12/793,270

(22) Filed: Jun. 3, 2010

(65) Prior Publication Data

US 2010/0237317 A1  Sep. 23, 2010

Related U.S. Application Data

(63) Continuation of application No. PCT/JP2007/073708, filed on Dec. 7, 2007.

(51) Int. Cl.
 *H01L 29/02* (2006.01)
(52) U.S. Cl. .. 257/2; 257/3; 257/4; 257/5; 257/E29.002; 438/102; 438/103; 438/104
(58) Field of Classification Search ............... 257/2–5, 257/E29.002; 438/102–103
See application file for complete search history.

(56) References Cited

U.S. PATENT DOCUMENTS

| | | | |
|---|---|---|---|
| 7,521,704 | B2 | 4/2009 | Lee et al. |
| 2004/0235200 | A1 | 11/2004 | Hsu et al. |
| 2007/0240995 | A1 | 10/2007 | Odagawa |
| 2009/0014710 | A1* | 1/2009 | Kawashima et al. ............. 257/5 |

FOREIGN PATENT DOCUMENTS

| | | |
|---|---|---|
| JP | 2004-349690 A | 12/2004 |
| JP | 2005-317976 A | 11/2005 |
| JP | 2007-173515 A | 7/2007 |
| JP | 2007-287761 A | 11/2007 |
| WO | 2006/075574 A1 | 7/2006 |
| WO | 2007/102483 A1 | 9/2007 |

OTHER PUBLICATIONS

A. Beck et al. "Reproducible switching effect in thin oxide films for memory applications", Applied Physics Letters, Jul. 3, 2000, pp. 139-141, vol. 77, No. 1.
B. J. Choi et al. "Resistive switching mechanism of TiO2 thin films grown by atomic-layer deposition", Journal of Applied Physics, Aug. 2005, pp. 033715-1 to 033715-10, vol. 98, Issue 3.
D. Lee et al. "Resistance switching of copper doped MoOx films for nonvolatile memory applications", Applied Physics Letters, Mar. 2007, pp. 122104-1 to 122104-3, vol. 90, Issue 12.
I. G. Baek et al. "Highly Scalable Non-volatile Resistive Memory using Simple Binary Oxide Driven by Asymmetric Unipolar Voltage Pulses", Electron Devices Meeting, 2004, IEDM Technical Digest, Dec. 13-15, 2004, pp. 587-590, IEEE International.

(Continued)

*Primary Examiner* — Jami M Valentine
(74) *Attorney, Agent, or Firm* — Westerman, Hattori, Daniels & Adrian, LLP

(57) ABSTRACT

A resistive random access memory includes a lower electrode; a metal oxide film formed on the lower electrode and having a variable resistance, the metal oxide film having a first portion containing a metal element forming the metal oxide film and a second portion richer in oxygen than the first portion; and an upper electrode formed on the metal oxide film.

20 Claims, 22 Drawing Sheets

OTHER PUBLICATIONS

S. Seo et al. "Reproducible resistance switching in polycrystalline NiO films", Applied Physics Letters, Dec. 6, 2004, pp. 5655-5657, vol. 85, No. 23.

International Search Report of PCT/JP2007/073708, mailing date of Feb. 12, 2008.

Japanese Office Action dated Sep. 11, 2012, issued in corresponding Japanese Patent Application No. 2009-544546, w/ partial English translation (6 pages).

* cited by examiner

RESISTIVE RANDOM ACCESS MEMORY, NONVOLATILE MEMORY, AND METHOD OF MANUFACTURING RESISTIVE RANDOM ACCESS MEMORY

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2007/073708, filed on Dec. 7, 2007, the entire contents of which are incorporated herein by reference.

FIELD

A certain aspect of the embodiments discussed herein is related to a memory and a method of manufacturing the same.

BACKGROUND

Conventionally, flash memories, ferroelectric random access memories (FeRAMs), and magnetoresistive random access memories (MRAMs) have been proposed and used as nonvolatile memories.

However, these conventional nonvolatile memories have encountered various problems as the device size becomes smaller and the integration density becomes higher.

For example, flash memories of the 32-nm node generation and beyond have encountered physical and intrinsic problems such as an increase in the crosstalk between cells, a decrease in the capacitive coupling between a floating gate and a control gate, and the reliability of a tunnel oxide film.

Further, in ferroelectric random access memories, the area of a capacitor that retains information has been reduced with reduction in size, so that it has become more difficult to write and read information stably and to retain information.

Further, magnetoresistive random access memories, which are current-driven devices, cannot avoid a sharp increase in power consumption when the integration density increases with reduction in size.

On the other hand, so-called resistive random access memories (ReRAMs), which use the voltage-induced resistance switching phenomenon found in binary transition metal oxides (TMOs) such as $TiO_2$ and NiO, have been proposed lately. (See, for example, below-listed Non-Patent Documents 1 through 3.)

FIG. 1A is a cross-sectional view of one of such resistive random access memories, providing an overview of its configuration. FIG. 1B is a diagram illustrating an operation of the resistive random access memory of FIG. 1A.

Referring to FIG. 1A, the resistive random access memory is a so-called unipolar type, and includes a lower electrode 11; a resistive film 12 of $TiO_2$, NiO, or the like, formed on the lower electrode 11; and an upper electrode 13 formed on the resistive film 12.

The transition metal oxide forming such a resistive film as the resistive film 12, for example, $TiO_2$ or NiO, normally does not present electrical conductivity and forms an insulator. It is known, however, that when such a device as illustrated in FIG. 1A is formed, and a high voltage is applied between the electrodes 11 and 13 to cause soft breakdown (called "forming"), a bi-stable condition thereafter appears where the resistance of the resistive film 12 switches between a high resistance state (HRS) and a low resistance state (LRS) as illustrated in FIG. 1B. (See, for example, below-listed Non-Patent Documents 1 through 3.)

Referring to FIG. 1B, such resistance switching of the resistive film 12 is induced symmetrically when the polarity of the voltage applied between the electrodes 11 and 13 is reversed. Accordingly, such a device is referred to as a unipolar device.

The mechanism of this phenomenon has not been clarified completely. It is considered, however, that this is because defects such as oxygen deficiencies are aligned to form an electrically conductive filament 12f in the resistive film 12 of a transition metal oxide as a result of the forming as illustrated in FIG. 1A.

That is, the resistive film 12 is believed to be in the low resistance state when this filament 12f is continuous and to be in the high resistance state when this filament 12f is discontinuous.

It is known that when the electrically conductive filament 12f is formed in the resistive film 12 by the forming process and the resistive film 12 is in the high resistance state in the device of FIG. 1A, the resistive film 12 is "set," that is, switches to the low resistance state, if the voltage applied between the electrodes 11 and 13 is increased to exceed a predetermined set voltage $V_{SET}$. This low resistance state is understood to be the result of the electrically conductive filament 12f illustrated in FIG. 1A becoming continuous, and is maintained even after returning the voltage applied between the electrodes 11 and 13 to zero. That is, in the device of FIG. 1A, it is possible to write information "1" or "0" by applying a voltage higher than or equal to the set voltage $V_{SET}$ between the electrodes 11 and 13.

On the other hand, it is known that in the device where the resistive film 12 has switched to the lower resistance state, if the voltage applied between the electrodes 11 and 13 is increased to exceed a predetermined reset voltage $V_{RESET}$, the resistance of the resistive film 12 sharply increases so that the resistive film 12 is "reset," that is, switches to the high resistance state. This high resistance state is understood to be the result of the electrically conductive filament 12f illustrated in FIG. 1A becoming discontinuous, and is maintained even after returning the voltage applied between the electrodes 11 and 13 to zero. That is, it is possible to write information "0" or "1" in the device of FIG. 1A. The information thus written is maintained even after supply voltage is shut off. Therefore, the device of FIG. 1A operates as a nonvolatile memory.

Further, in the device of FIG. 1A, it is possible to determine whether the resistive film 12 is in the high resistance state or the low resistance state by applying a voltage lower than the reset voltage $V_{RESET}$ between the electrodes 11 and 13 and detecting a current flowing through the resistive film 12. In other words, it is possible to read information in the nonvolatile memory including the device of FIG. 1A.

It is conventionally known that in such a resistive random access memory, the state transition of the resistive film 12 from the high resistance state to the low resistance state ("set") occurs in an extremely short period of time of approximately 10 ns, while a change from the low resistance state to the high resistance state ("reset") takes a very long period of time of approximately 5 μs. (See, for example, Non-Patent Document 2 listed below.)

[Non-Patent Document 1] S. Seo, M. J. Lee, D. H. Seo, E. J. Jeoung, D.-S. Suh, Y. S. Joung, I. K. Yoo, I. R. Hwang, S. H. Kim, I. S. Byun, J.-S. Kim, J. S. Choi, and B. H. Park, "Reproducible resistance switching in polycrystalline NiO films," Appl. Phys. Lett. 85, 5655 (2004).

[Non-Patent Document 2] I. G. Baek, M. S. Lee, S. Seo, M. J. Lee, D. H. Seo, D.-S. Suh, J. C. Park, S. O. Park, H. S. Kim, I. K. Yoo, U.-In Chung, and J. T. Moon, "Highly Scalable Non-volatile Resistive Memory using Simple Binary Oxide Driven by Asymmetric Unipolar Voltage Pulses," IEDM Tech. Dig., 2004, p. 587.

[Non-Patent Document 3] B. J. Choi, D. S. Jeong, S. K. Kim, C. Rohde, S. Choi, J. H. Oh, H. J. Kim, C. S. Hwang, K. Szot, R. Waser, B. Reichenberg, and S. Tiedke, "Resistive switching mechanisms of $TiO_2$ thin films grown by atomic-layer deposition," J. Appl. Phys. 98, 033715 (2005).

[Non-Patent Document 4] A. Beck, J. G. Bednorz, Ch. Gerber, C. Rossel, and D. Widmer, "Reproducible switching effect in thin oxide films for memory applications," Appl. Phys. Lett. 77, 139 (2000).

[Non-Patent Document 5] Dongsoo Lee, Dong-jun Seong, Inhwa Jo, F. Xiang, R. Dong, Seokjoon Oh, and Hyunsang Hwang, "Resistance switching of copper doped $MoO_x$ films for nonvolatile memory applications," Appl. Phys. Lett. 90, 122104 (2007).

SUMMARY

According to an aspect of the invention, a resistive random access memory includes a lower electrode; a metal oxide film formed on the lower electrode and having a variable resistance, the metal oxide film having a first portion containing a metal element forming the metal oxide film and a second portion richer in oxygen than the first portion; and an upper electrode formed on the metal oxide film.

According to another aspect of the invention, a resistive random access memory includes a lower electrode; a nickel oxide film formed on the lower electrode and having a variable resistance, the nickel oxide film containing titanium with such a depth profile so that the titanium has a peak near an interface between the lower electrode and the nickel oxide film; and an upper electrode formed on the nickel oxide film.

According to yet another aspect of the invention, a method of manufacturing a resistive random access memory includes forming a lower electrode; forming a metal oxide film on the lower electrode; and forming an upper electrode on the metal oxide film, wherein forming the metal oxide film includes forming a first portion containing a metal element forming the metal oxide film; and forming a second portion richer in oxygen than the first portion.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

As described above, it is conventionally known that in the resistive random access memory as described above, the state transition of the resistive film 12 from the high resistance state to the low resistance state ("set") occurs in an extremely short period of time of approximately 10 ns, while a change from the low resistance state to the high resistance state ("reset") takes a very long period of time of approximately 5 μs.

In respect to this, the inventor of the present invention has found in the research that forms the basis of the present invention that in the case of "reset," the resistance varies greatly in the repeated rewriting of the resistive film 12 and "reset" is complete in all cases after a lengthy reset process.

Figure 2:
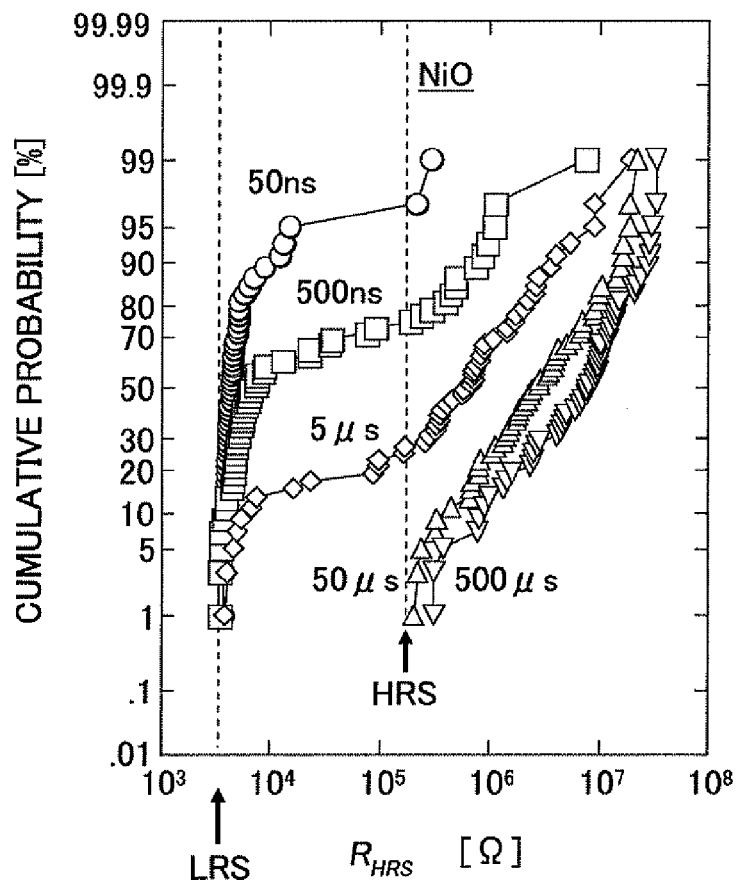
FIG. 2 is a diagram illustrating a problem to be solved by the invention.

FIG. 2 is a graph illustrating such "reset."

In the experiment illustrated in FIG. 2, a NiO film of 10 nm in thickness is used as the resistive film 12 and a reset pulse of a voltage $V_{RESET}$ is applied between the electrodes 11 and 13. FIG. 2 illustrates that in the state transition of the resistive film 12 from the low resistance state (LRS) to the high resistance state (HRS), the transition is incomplete in most cases when the pulse width of the voltage pulse is 50 ns and that the number of cases where the transition is incomplete is larger than the number of cases where the transition is complete even with a pulse width of 500 ns. FIG. 2 also illustrates that the transition to the high resistance state is complete in most cases when the pulse width is 5 μs and that a pulse width of 50 μs is necessary for the transition to the high resistance state to be complete in all of the cases.

A detailed description is given below of FIG. 2 as a comparative example of the present invention.

Figure 1A:
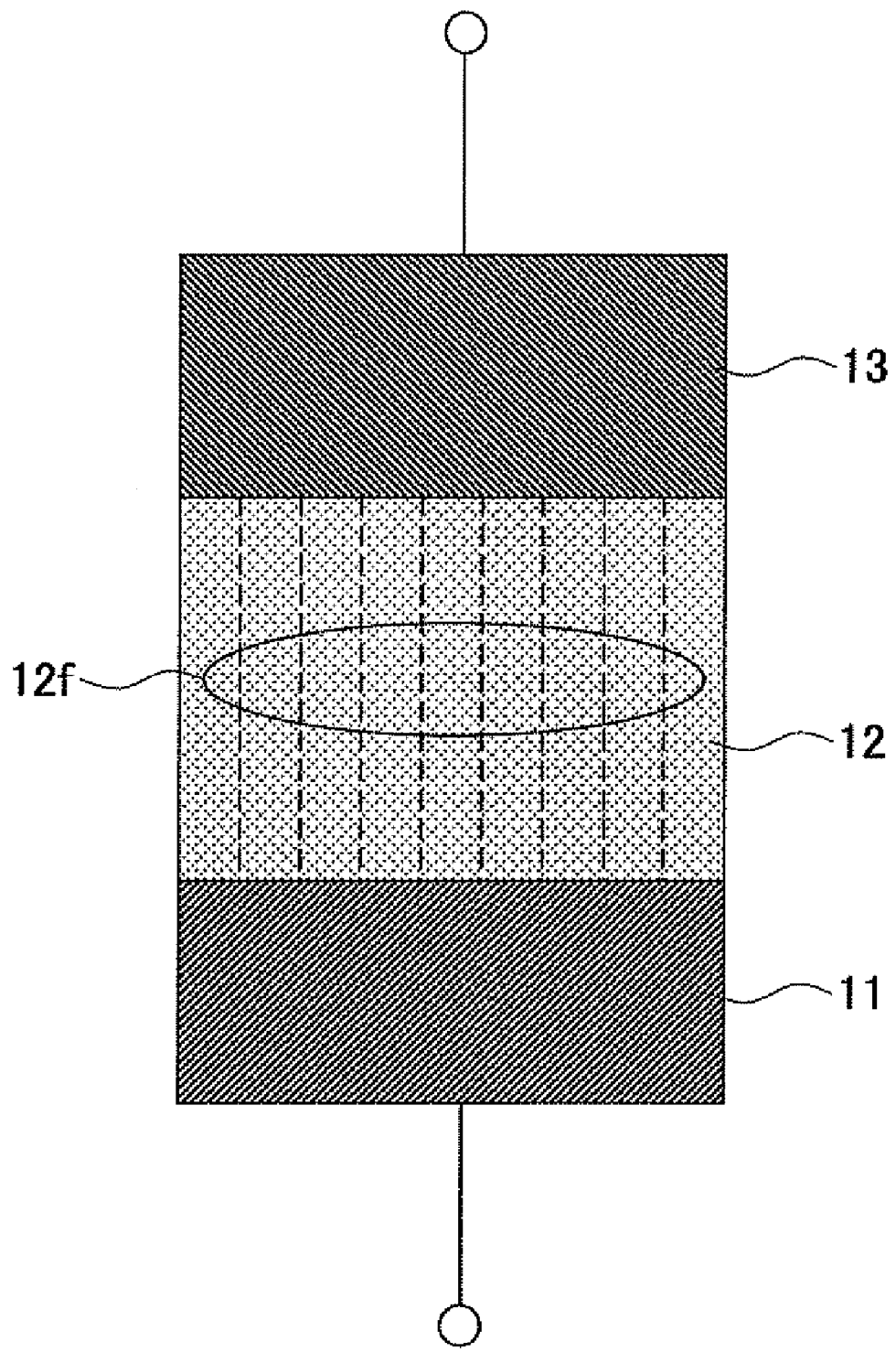
FIG. 1A is a diagram illustrating the principle of a resistive random access memory.
Figure 1B:
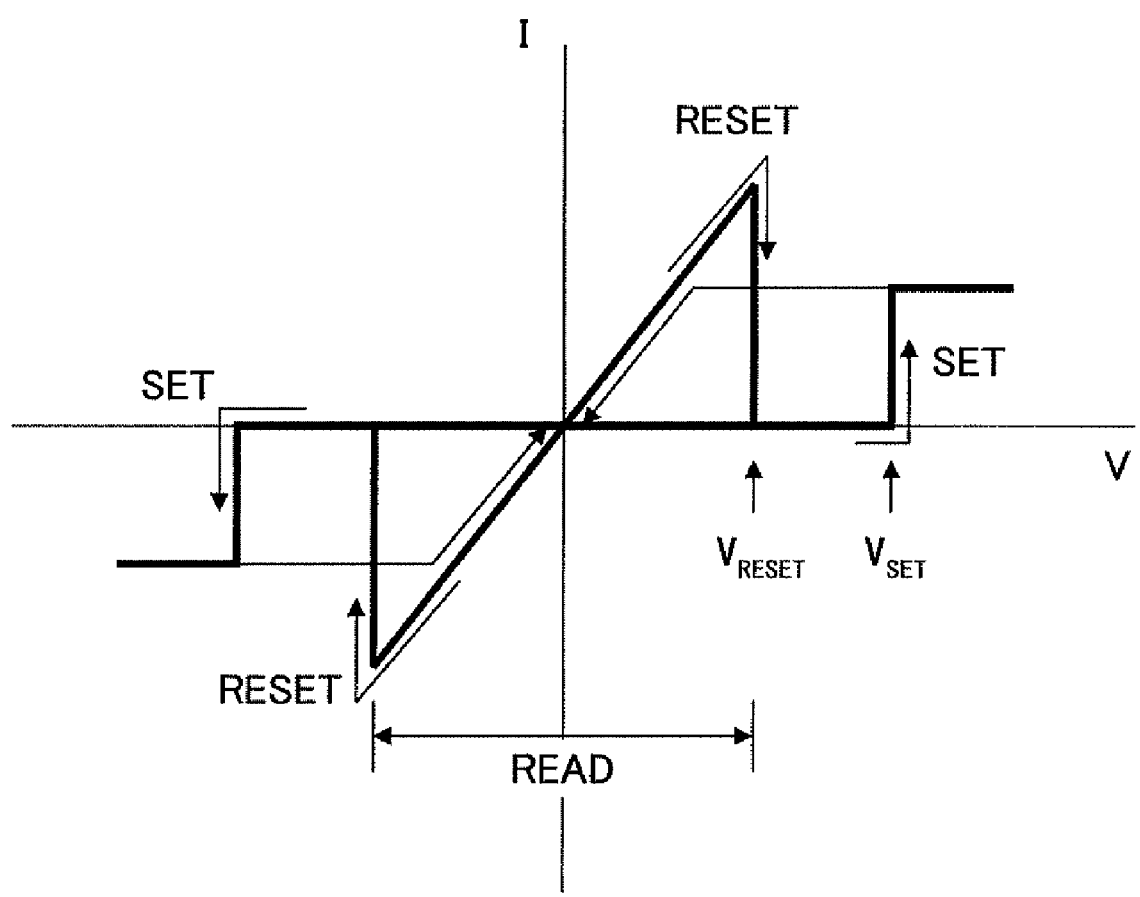
FIG. 1B is a graph illustrating the principle of the resistive random access memory.

If it is possible to reduce a reset time in a resistive random access memory that has a configuration as illustrated in FIG. 1A and operates as illustrated in FIG. 1B, it is possible to achieve a high-speed memory device with a simple configuration. Further, if it is possible to suppress a variation in resistance in the high resistance state, the possibility of realizing multi-level recording in the resistive random access memory of FIG. 1A is opened.

Preferred embodiments of the present invention will be explained with reference to accompanying drawings.

[a] First Embodiment

FIGS. 3A through 3E are diagrams illustrating a process for manufacturing a variable resistance metal-insulator-metal (MIM) device used in a resistive random access memory according to a first embodiment.

Figure 3A:
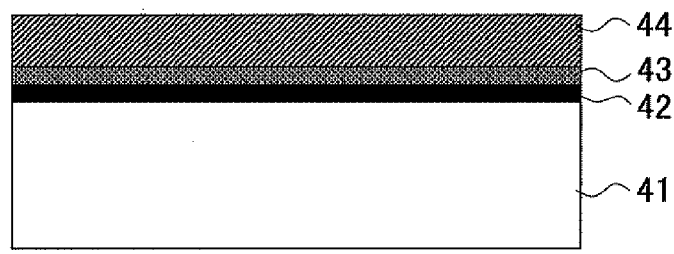
FIGS. 3A through 3F are diagrams illustrating a process for manufacturing a resistive metal-insulator-metal (MIM) device according to a first embodiment.

Referring to FIG. 3A, a titanium (Ti) adhesion film 42 of 10 nm in thickness, a titanium nitride (TiN) diffusion barrier film 43 of 10 nm in thickness, and a lower electrode film 44 of platinum (Pt) of 100 nm in thickness are successively formed on an insulating film 41 by sputtering. For example, the Ti adhesion film 42 may be formed by inputting plasma power of 1 kW at a substrate temperature of 50° C. in an argon (Ar) atmosphere of 0.5 Pa by sputtering using Ti as a target. Further, the TiN diffusion barrier film 43 may be formed by inputting plasma power of 2 kW at a substrate temperature of 300° C. in an argon/nitrogen (Ar/N$_2$) atmosphere containing Ar gas at a partial pressure of 0.25 Pa and N$_2$ gas at a partial pressure of 0.25 Pa by reactive sputtering using Ti as a target. Further, the lower Pt electrode film 44 may be formed by inputting plasma power of 1 kW at a substrate temperature of 300° C. in an Ar atmosphere of 0.5 Pa by sputtering using Pt as a target.

Figure 3B:
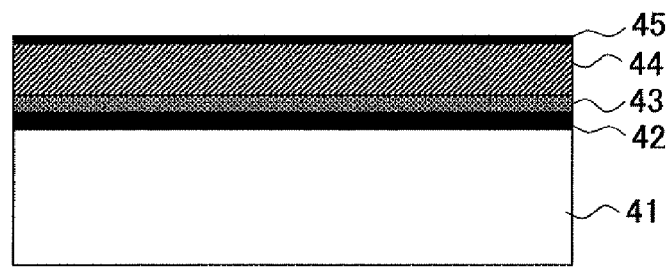

Next, as illustrated in FIG. 3B, an extremely thin Ti film 45 of 1 nm to 3 nm, preferably 2 nm, in thickness is formed on the lower Pt electrode film 44 of FIG. 3A by inputting plasma power of 0.5 kW at a substrate temperature of 50° C. in an Ar atmosphere of 0.5 Pa by sputtering using Ti as a target. This thin Ti film 45 may be discontinuous to form an island structure on the lower Pt electrode film 44.

Figure 3C:
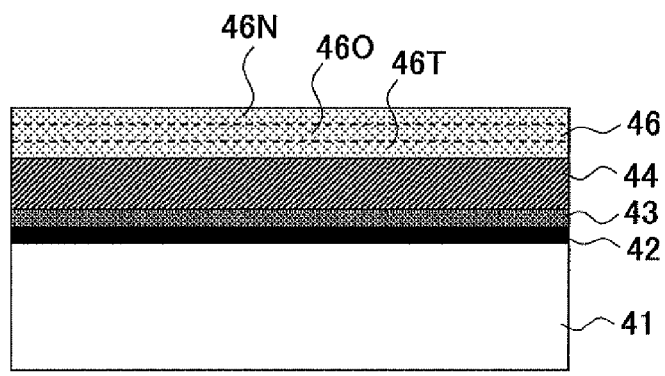

Next, as illustrated in FIG. 3C, a nickel oxide (NiO) film 46 of 5 nm to 10 nm in thickness is formed on the Ti film 45 of FIG. 3B by inputting plasma power of 1 kW at a substrate temperature of 380° C. in an argon/oxygen (Ar/O$_2$) atmosphere containing Ar gas at a partial pressure of 0.45 Pa and O$_2$ gas at a partial pressure of 0.05 Pa by reactive sputtering using Ni as a target.

Figure 4A:
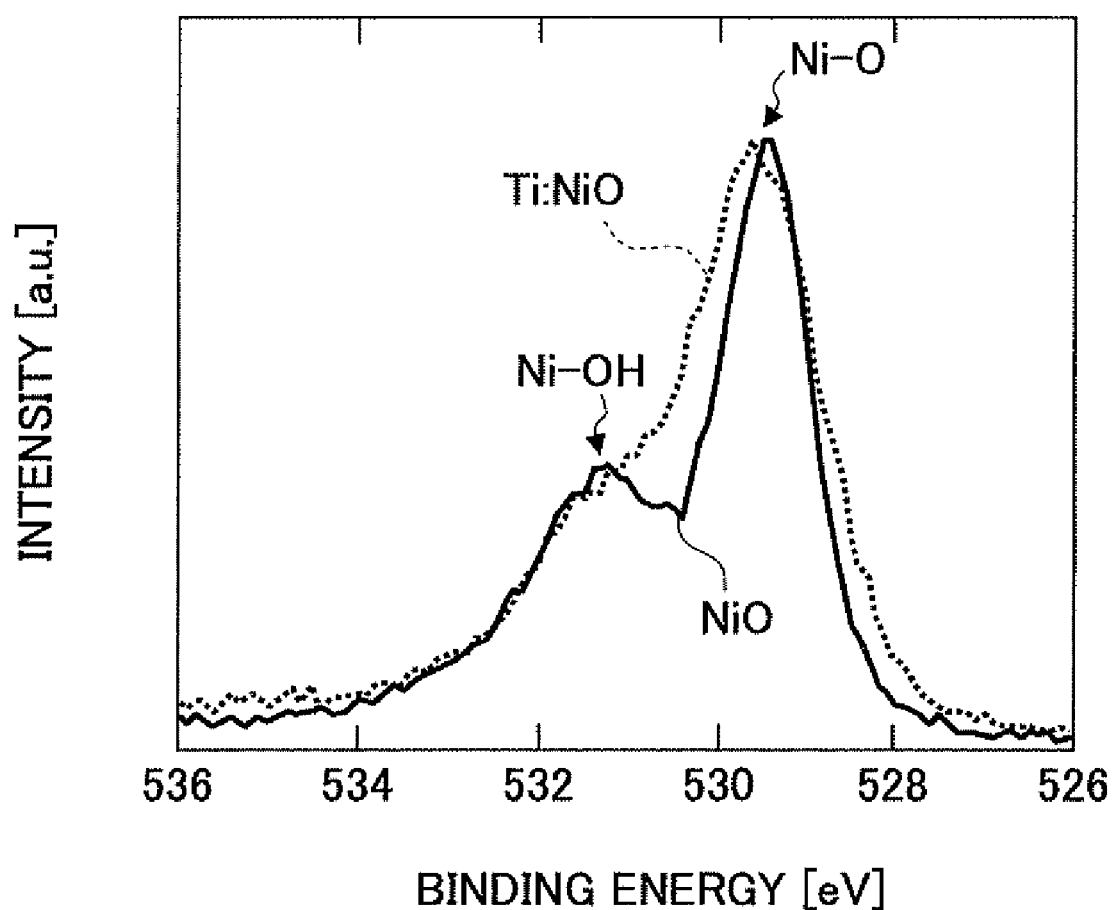
FIG. 4A is a graph illustrating the X-ray photoelectron spectroscopy (XPS) spectrum of a resistive film in the resistive MIM device of FIG. 3F according to the first embodiment.
Figure 4B:
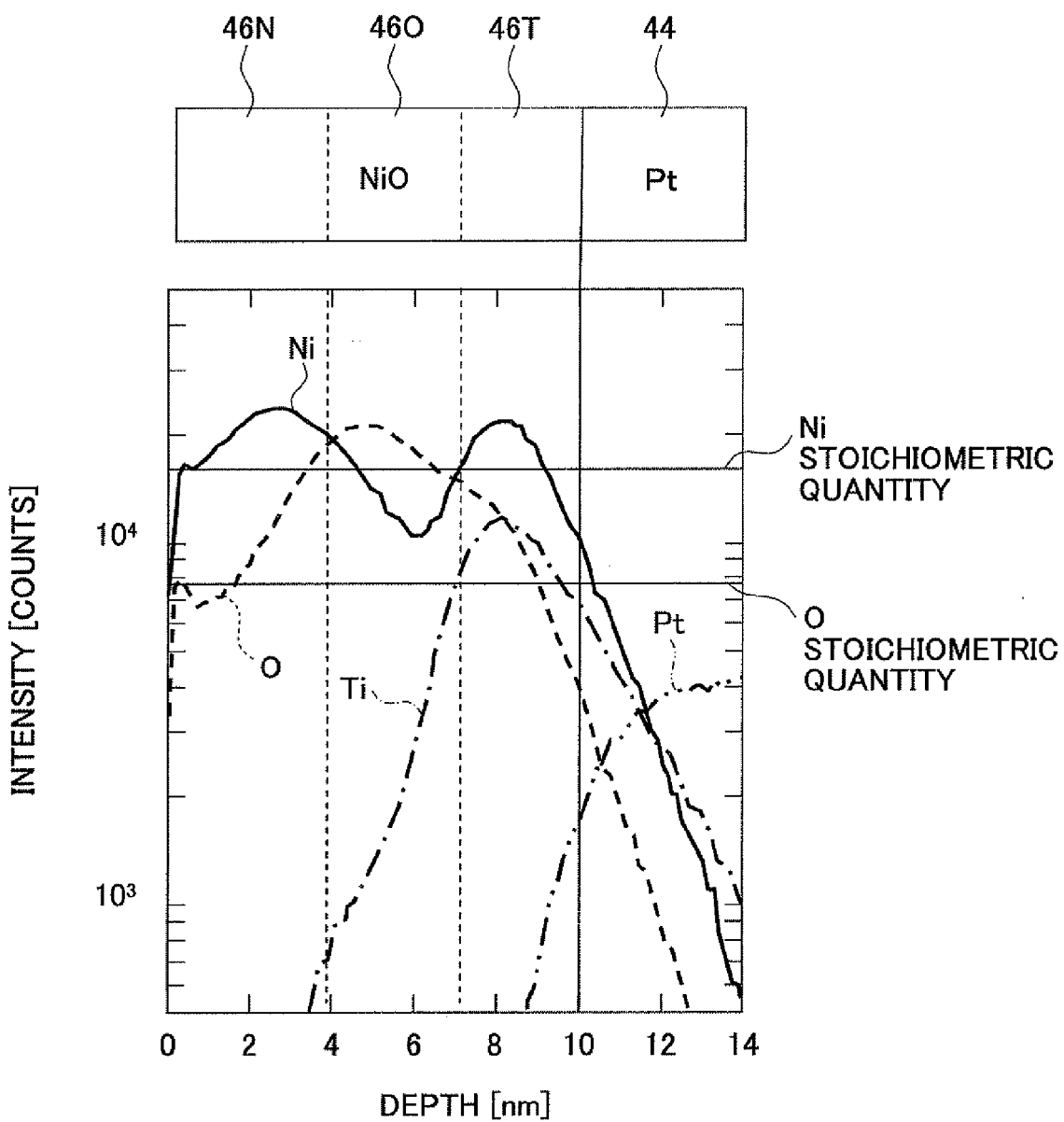
FIG. 4B is a graph illustrating secondary ion mass spectrometry (SIMS) profile of the resistive film in the resistive MIM device of FIG. 3F according to the first embodiment.

FIG. 4A illustrates the X-ray photoelectron spectroscopy (XPS) spectrum of the O is orbital in the NiO film 46 thus obtained. The measurement of FIG. 4A was performed to obtain information on a deep portion of the NiO film 46 as well by setting the photoelectron take-off angle at 45 degrees. In FIG. 4A, the graph indicated by "Ti:NiO" illustrates the result of the NiO film 46. Further, FIG. 4A also illustrates the result of a sample having no Ti film 45 formed in the process of FIG. 3B as a reference standard (indicated by "NiO") for comparison. FIG. 4B illustrates the secondary ion mass spectrometry (SIMS) profile obtained by analyzing the distribution of Ni, oxygen (O), Ti, and Pt in the thus obtained NiO film 46 using SIMS.

Referring to FIG. 4A, in the sample of the reference standard, the O 1 s binding energy presents a sharp peak at a position corresponding to a Ni—O bond. Further, another separate peak is observed at a position corresponding to a Ni—OH bond. On the other hand, in the NiO film 46, a peak representing the Ni—O bond is broad and the separation of the Ni—O bond peak and the Ni—OH bond peak is not clear, compared with the reference standard.

The results of FIG. 4A illustrate that Ti is diffused to disturb the crystal structure of NiO significantly in the NiO film 46 formed on the extremely thin Ti film 45 as illustrated in FIG. 3C.

Next, referring to the SIMS profile of FIG. 4B, while the detection intensities of Ni atoms and oxygen atoms are supposed to be expressed by the "Ni stoichiometric quantity" and the "O stoichiometric quantity," respectively, of FIG. 4B if the NiO film 46 has a stoichiometric composition, actually, as illustrated in FIG. 4B, in the NiO film 46, more Ni than its stoichiometric quantity concentrates near the surface in the range of approximately 0 nm to approximately 3 nm in depth to form a Ni-rich layer 46N, more atoms of oxygen (O) than its stoichiometric quantity concentrate under the Ni-rich layer 46N in the range of approximately 3 nm to approximately 7 nm in depth to form an oxygen-rich layer 46O that is deficient in Ni, and a Ti-rich layer 46T where Ti and Ni concentrate is formed under the oxygen-rich layer 46O in the range of approximately 7 nm to 10 nm in depth.

Figure 4C:
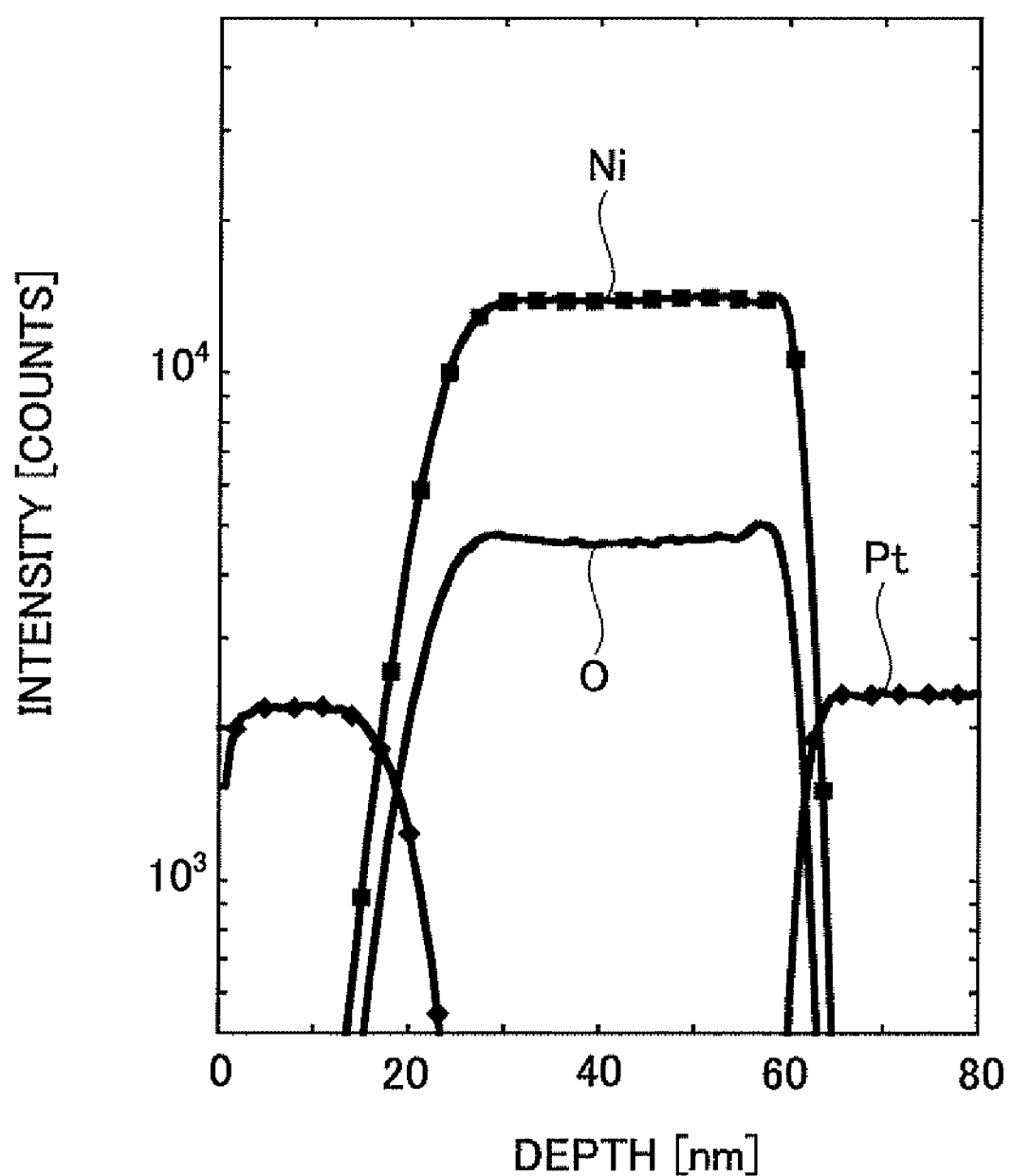
FIG. 4C is a graph illustrating a SIMS profile of a common Pt/NiO/Pt structure.

On the other hand, FIG. 4C is a SIMS profile illustrating the depth distribution of Ni, O, and Pt in a common variable resistance MIM device without the Ti film 45, having a NiO film sandwiched between a lower Pt electrode film and an upper Pt electrode film. FIG. 4C illustrates that such a region of oxygen concentration as illustrated in FIG. 4B is not formed in the NiO film. In FIG. 4C, the depth of 0 nm corresponds to the surface of the upper Pt electrode film.

Referring back to FIG. 4B, the peak of Ti in the NiO film 46 is formed near the surface of the Pt electrode film 44. Since Ti atoms are diffused to the neighborhood of the surface of the Ni-rich layer 46N, a Ni peak corresponding to the Ti peak is formed, and the crystal structure of NiO forming the NiO film 46 is significantly disturbed as illustrated in FIG. 4A, it is believed that at the stage of FIG. 3C, substantially the entire thin Ti film 45 formed on the lower Pt electrode film 44 in the process of FIG. 3B is diffused into the NiO film 46 so that the Ti film 45 no longer remains as a Ti film at the interface between the lower Pt electrode film 44 and the NiO film 46.

Such local shifts from a stoichiometric composition in the NiO film 46 as illustrated in FIG. 4B are believed to be caused as a result of the NiO film 46 being doped with Ti from the Ti film 45. It is believed that as a result of the strong affinity of oxygen to Ti, more precisely, as a result of a Gibbs free energy change ΔG in the reaction Ti+O$_2$→TiO$_2$ being a large negative value, oxygen atoms move in the direction of the Ti-rich layer 46T from the Ni-rich layer 46N to form the oxygen-rich layer 46O. Further, referring to the profile of oxygen atoms, a peak is generated in the oxygen-rich layer 46O where the profile of Ti diffused from the Ti-rich layer 46T is clearly presented, which indicates that the concentration of oxygen occurs in accordance with the diffusion of Ti.

Further, according to the SIMS profile of FIG. 4B, a Ni peak that coincides with the Ti peak is also observed in the Ti-rich layer 46T. This indicates the presence of the correlation between the distribution of Ti and the distribution of Ni. That is, it is believed that the diffusion of Ni in the direction of the Ti peak advances concentration in the oxygen concentration region to a further extent.

In such a SIMS profile analysis as illustrated in FIG. 4B, the detection intensities of elements do not correspond to their composition ratio on a one-to-one basis. Therefore, a chemical analysis was conducted on the sample subjected to the above-described SIMS profile analysis, particularly on a surface portion of the NiO film 46, by XPS, setting the photoelectron take-off angle at 15 degrees. The resultant ratio of Ni atoms, oxygen atoms, and Ti atoms was 49:50:1 within the range of 2 nm from the surface of the NiO film 46, and thus it has been found that the stoichiometric composition is substantially maintained in that range. This situation corresponds to the detection intensity of Ni being higher than the detection intensity of oxygen within the range of 2 nm from the surface of the NiO film 46 in the SIMS analysis of FIG. 4B.

According to this embodiment, the oxygen-rich layer 46O, which has shifted from the stoichiometric composition, is thus formed locally in the NiO film 46 by diffusing Ti into the NiO film 46 from the lower electrode film 44 side. As described in detail below, in a variable resistance MIM device using this NiO film 46, it is possible to swiftly switch the state of the NiO film 46 from the low resistance state to the high resistance state by quickly interrupting such a conductive filament as illustrated in FIG. 1A by supplying the conductive filament with oxygen ions from the oxygen-rich layer 46O at the time of a "reset" operation.

Figure 3D:
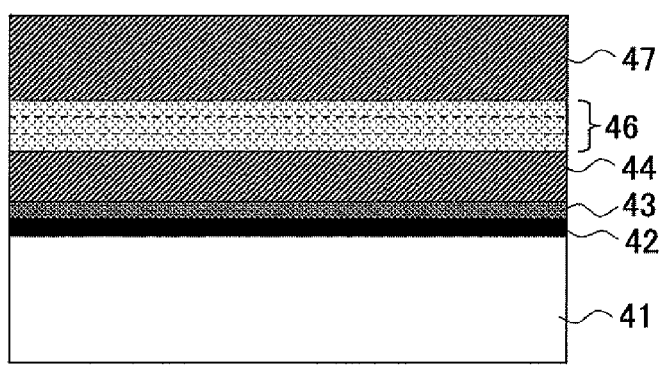

Next, referring to FIG. 3D, an upper Pt electrode film 47 of 50 nm in thickness is formed on the NiO film 46 of FIG. 3C by inputting plasma power of 1 kW at a substrate temperature of 50° C. in an Ar atmosphere of 0.5 Pa by sputtering using Pt as a target.

Figure 3E:
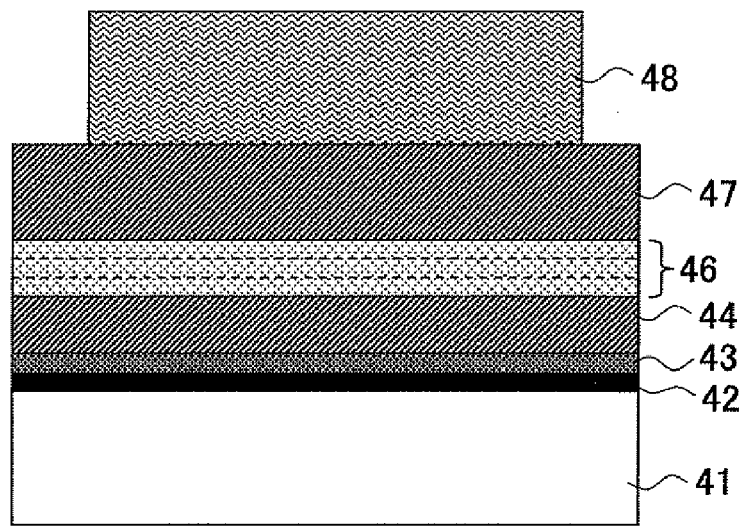

Further, as illustrated in FIG. 3E, a resist pattern 48 is formed on the upper Pt electrode film 47. Then, the upper Pt electrode film 47, the NiO film 46, the lower Pt electrode film 44, the TiN diffusion barrier film 43, and the Ti film 42 are patterned by dry etching, using the resist pattern 48 as a mask. As a result, a variable resistance MIM device 40 illustrated in FIG. 3F is formed.

Figure 3F:
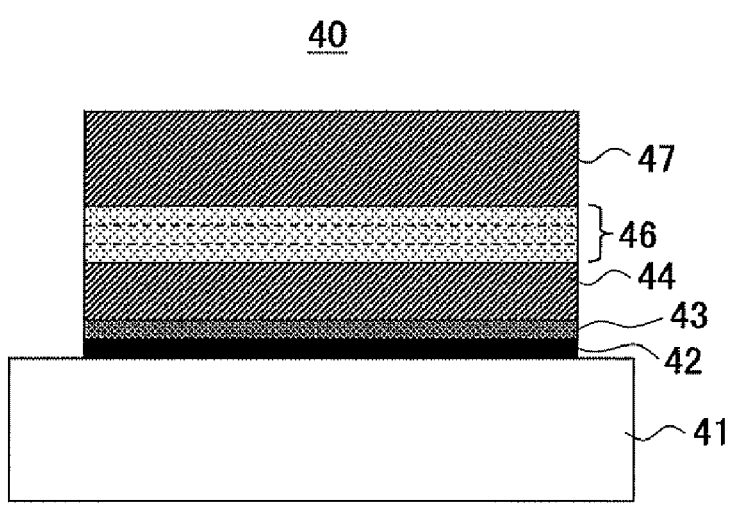
Figure 5A:
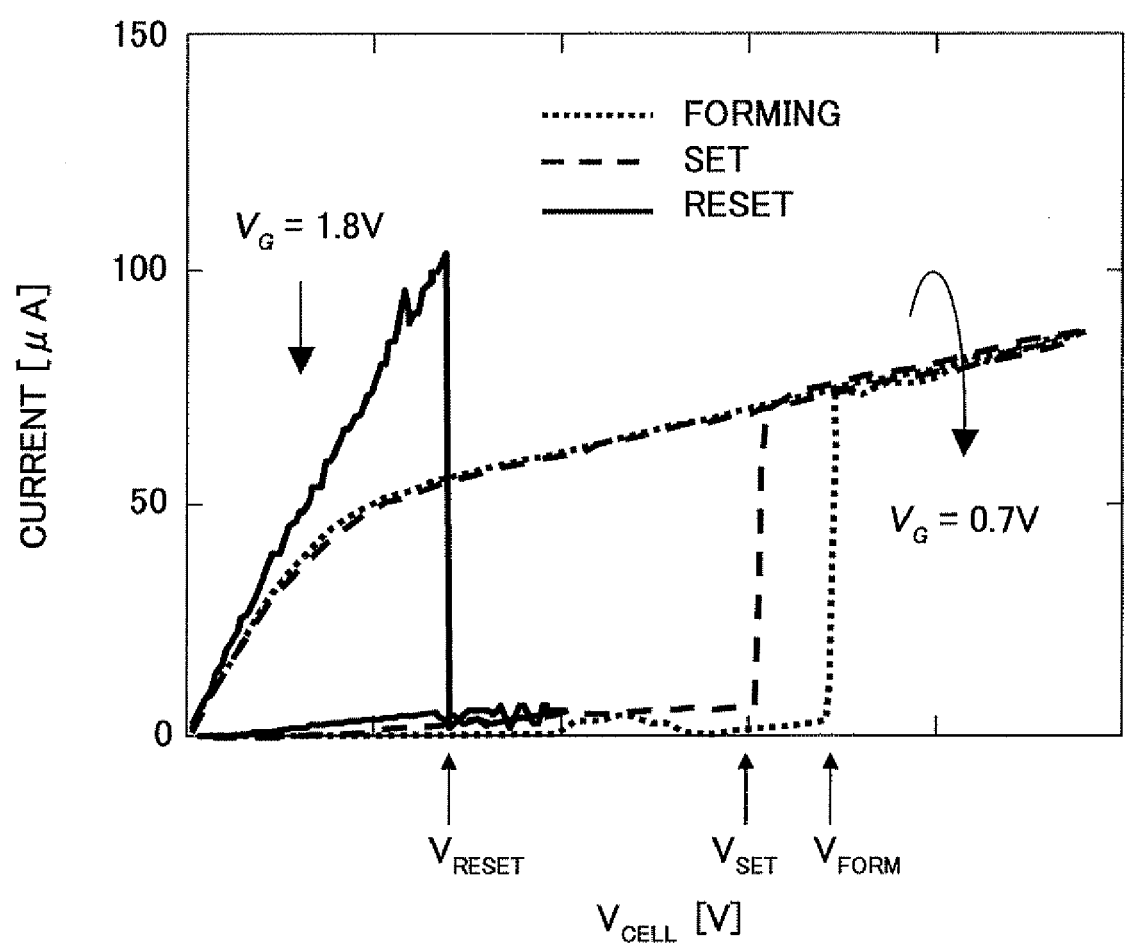
FIG. 5A is a graph illustrating operating characteristics of the resistive MIM device of FIG. 3F according to the first embodiment.
Figure 5B:
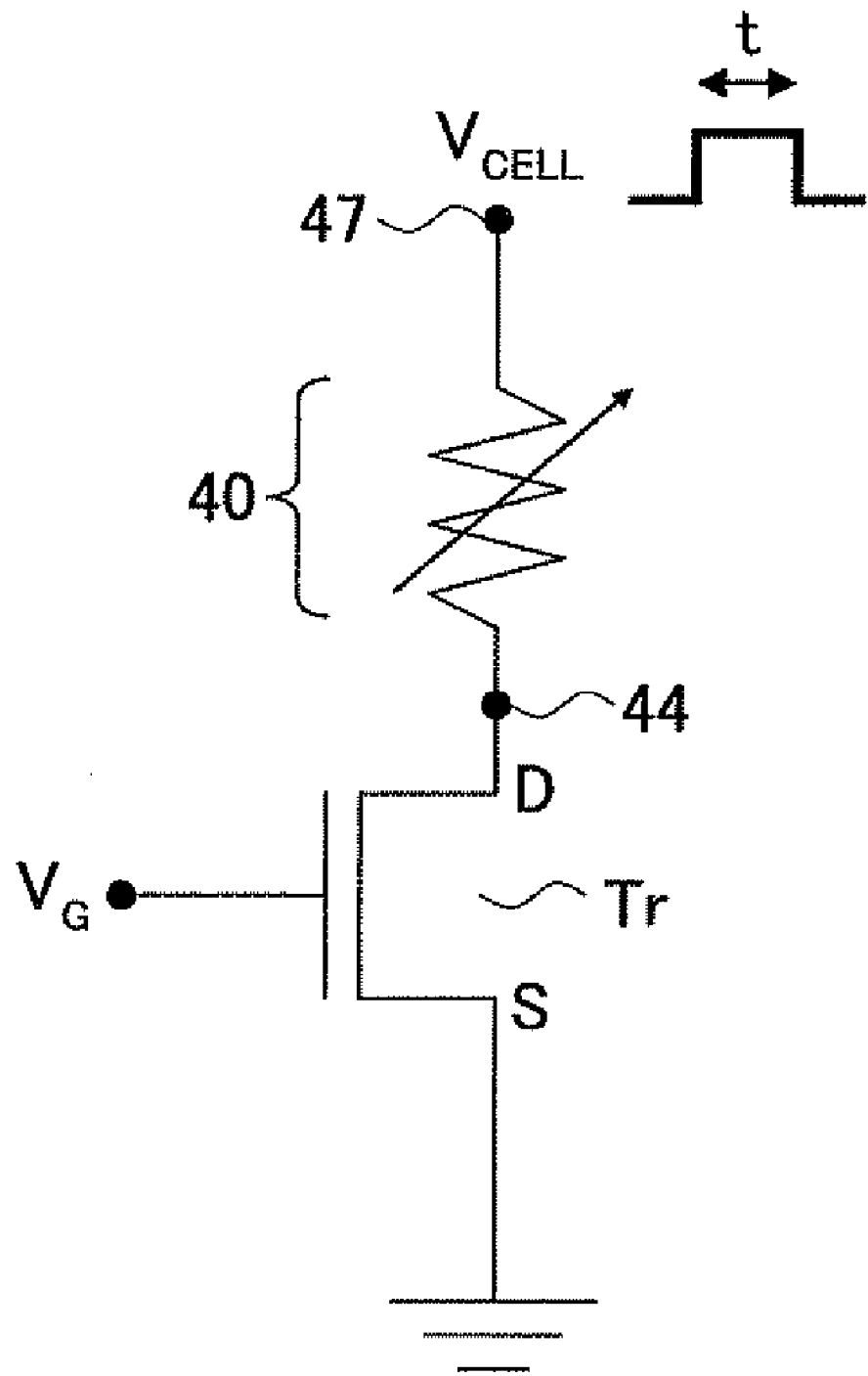
FIG. 5B is a diagram illustrating a measurement circuit used in the invention.

FIG. 5A illustrates the operating characteristics of the variable resistance MIM device 40 of FIG. 3F determined using a measurement circuit illustrated in FIG. 5B.

Referring first to FIG. 5B, the variable resistance MIM device 40 has its lower electrode film 44 connected to a drain terminal D of a transistor Tr, which is driven by a gate voltage $V_G$ and has a grounded source terminal S. The operating characteristics of FIG. 5A have been determined by performing sweeping of a voltage pulse $V_{CELL}$ applied to the upper electrode film 47 of the variable resistance MIM device 40 with the gate voltage $V_G$ applied to the gate of the transistor Tr and measuring current flowing through the variable resistance MIM device 40 and the transistor Tr. By connecting the transistor Tr as described above to the variable resistance MIM device 40 in series, it is possible to prevent excessive current from flowing through the variable resistance MIM device 40 at the time of forming or "set." For example, as described below, at the time of forming and "set," it is possible to limit the maximum value of current flowing through the variable resistance MIM device 40 to 100 µA or lower by setting the gate voltage $V_G$ to 0.7 V. On the other hand, at the time of "reset," the gate voltage $V_G$ may be set at, for example, 1.8 V so as to allow a high voltage to be applied to the NiO film 46.

Referring to FIG. 5A, it is found that forming occurs when the voltage $V_{CELL}$ reaches $V_{FORM}$ in the case of the gate voltage $V_G$ being set at 0.7 V. By such forming, such a conductive filament as described in FIG. 1A is formed in the NiO film 46. In this state, the NiO film 46 is in the low resistance state, and it is found that a current greater than or equal to 50 µA flows through the NiO film 46 when the voltage $V_{CELL}$ is increased from 0 V. However, as described above, the current limiting function of the transistor Tr prevents the current from exceeding 100 µA.

On the other hand, when the voltage $V_{CELL}$ is increased from 0 V with the gate voltage $V_G$ being set at 1.8 V in this variable resistance MIM device 40 in the low resistance state, the current flowing through the NiO film 46 drops sharply from approximately 100 µA to approximately 5 µA or less in response to the voltage $V_{CELL}$ reaching a voltage $V_{RESET}$. This indicates the occurrence of a transition from the low resistance state to the high resistance state, that is, "reset," in the NiO film 46.

Further, when the voltage $V_{CELL}$ is increased from 0 V with the gate voltage $V_G$ being set at 0.7 V in this variable resistance MIM device 40 in the high resistance state, the NiO film 46 switches from the high resistance state to the low resistance state at a voltage $V_{SET}$, and the current flowing through the NiO film 46 rises sharply from initial approximately 5 µA to approximately 70 µA, indicating the occurrence of "set."

Therefore, in the variable resistance MIM device 40 of FIG. 3F, it is possible to write data "1" in correspondence to the low resistance state by "set" and write data "0" in correspondence to the high resistance state by "reset" after forming is performed. Further, it is possible to read the written data in the form of the magnitude of current by applying a voltage lower than or equal to 0.7 V to the upper electrode film 47 as the voltage $V_{CELL}$.

Figure 6:
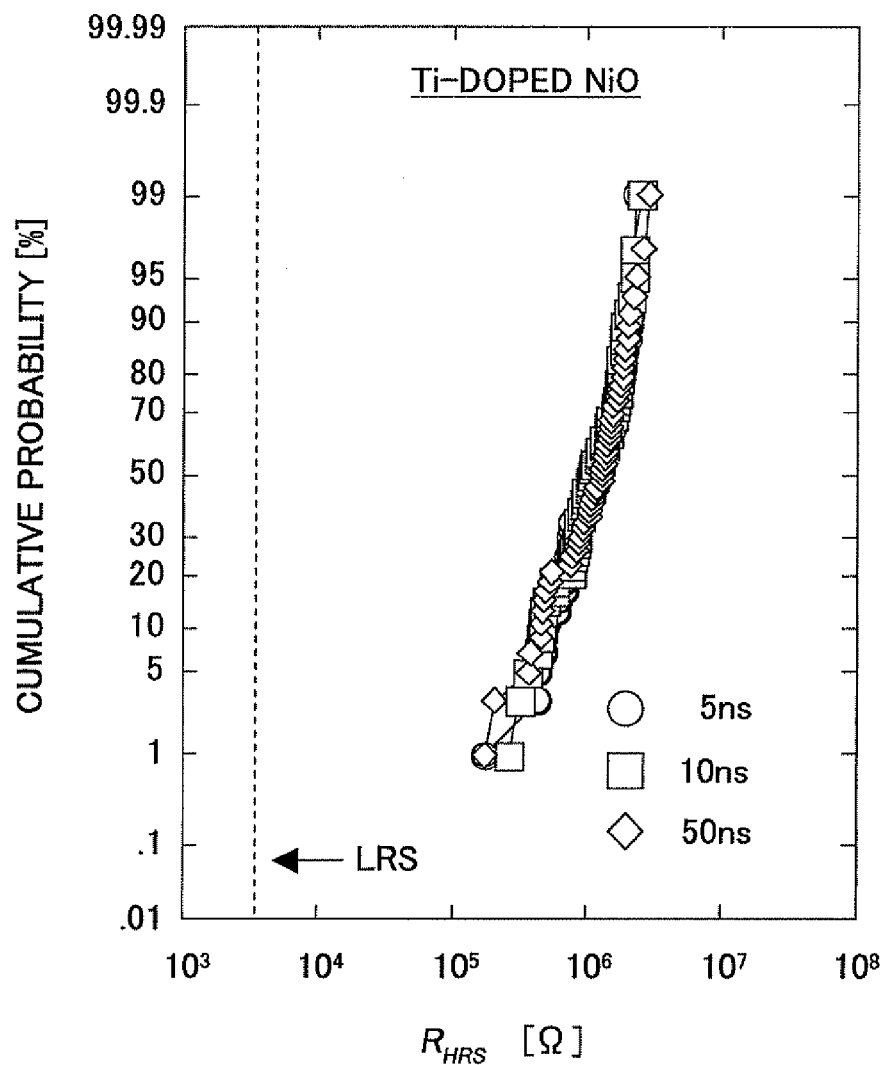
FIG. 6 is a graph illustrating effects according to the first embodiment.

FIG. 2 described above is a graph illustrating transitions of resistance in the case of alternately repeating switching from the low resistance state (LRS) to the high resistance state (HRS) and switching from the high resistance state to the low resistance state 50 times each with respect to the reference standard sample of this embodiment, in which the Ti film 45 illustrated in FIG. 3B is not formed and thus no Ti is introduced in a NiO film forming a resistive film in the variable resistance MIM device structure of FIG. 3F. On the other hand, FIG. 6 is a graph illustrating transitions of resistance in the case of alternately repeating switching from the low resistance state (LRS) to the high resistance state (HRS) and switching from the high resistance state to the low resistance state 50 times each with respect to the variable resistance MIM device 40 of FIG. 3F. In FIG. 2 and FIG. 6, the NiO resistive films (the NiO film 46 in the case of FIG. 6) are 10 nm and 8 nm, respectively, in thickness.

In each of the experiments of FIG. 2 and FIG. 6, the measurement circuit illustrated in FIG. 5B was used, and the gate voltage applied to the gate of the transistor Tr was 0.8 V, 1.8 V, and 1.8 V at the time of "set," "reset," and reading, respectively, as arranged in Table 1 below. Further, in each of the experiments of FIG. 2 and FIG. 6, a voltage pulse having a magnitude of 2.8 V and a pulse width of 10 ns was applied as the voltage $V_{CELL}$ at the time of "set," and a voltage pulse having a magnitude of 0.1 V was applied as the voltage $V_{CELL}$ at the time of reading.

TABLE 1

|  | SET | RESET | READ |
|---|---|---|---|
| $V_G$ | 0.8 V | 1.8 V | 1.8 V |
| $V_{CELL}$ | 2.8 V/10 ns | SEE DESCRIPTION AND DRAWINGS | 0.1 V |

In FIG. 2 and FIG. 6, the horizontal axis represents the resistance of the NiO resistive film in the high resistance state ($R_{HRS}$), and the vertical axis represents the cumulative probability of the resistance ($R_{HRS}$).

In the experiment of FIG. 2, a voltage pulse of 1.0 V in magnitude was applied as the voltage $V_{CELL}$ with a pulse width t (FIG. 5B) varying from 50 ns to 500 μs at the time of "reset." In the experiment of FIG. 6, a voltage pulse of 1.8 V in magnitude was applied as the voltage $V_{CELL}$ with the pulse width t varying from 5 ns to 50 ns at the time of "reset." A description is given below of the reason why the "reset"-time voltage $V_{CELL}$ differs between the experiment of FIG. 2 and the experiment of FIG. 6.

The sample used in the comparative experiment of FIG. 2 is formed in the process illustrated in FIGS. 7A through 7E.

Figure 7A:
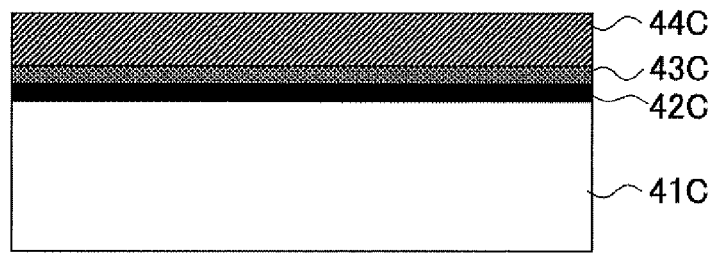
FIGS. 7A through 7E are diagrams illustrating a process for manufacturing a resistive MIM device that serves as a comparative example according to the first embodiment.

Referring to FIG. 7A, a titanium (Ti) adhesion film 42C of 10 nm in thickness, a titanium nitride (TiN) diffusion barrier film 43C of 10 nm in thickness, and a lower electrode film 44C of platinum (Pt) of 100 nm in thickness, which correspond to the Ti adhesion film 42, the TiN diffusion barrier film 43, and the lower electrode film 44 (FIG. 3A), respectively, are successively formed on an insulating film 41C, which corresponds to the insulating film 41 (FIG. 3A), by sputtering.

Figure 7B:
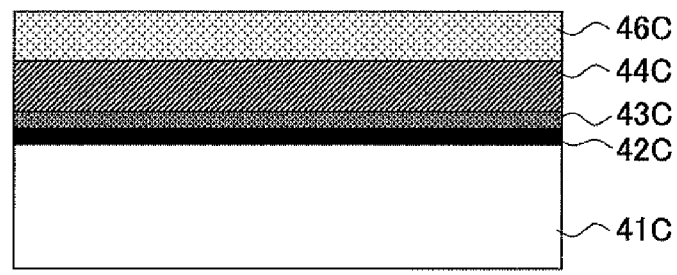

Next, in the process of FIG. 7B, which corresponds to the process of FIG. 3C, a nickel oxide (NiO) film 46C of 5 nm to 10 nm in thickness is formed on the lower electrode film 44C of FIG. 7A by reactive sputtering using Ni as a target in the same manner as the NiO film 46. In this comparative example, no dopant film is formed on the lower electrode film 44C. Accordingly, no such doping as illustrated in FIG. 3C occurs to the NiO film 46C.

Figure 7C:
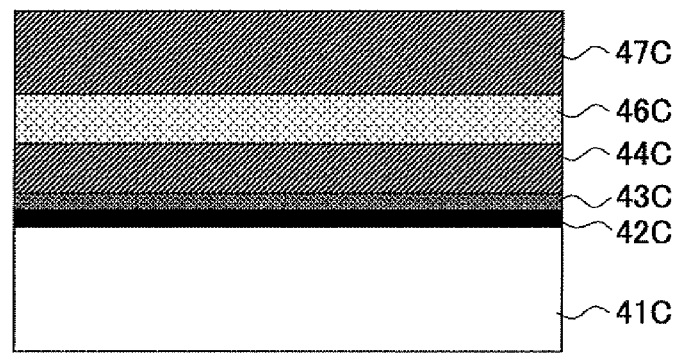
Figure 7D:
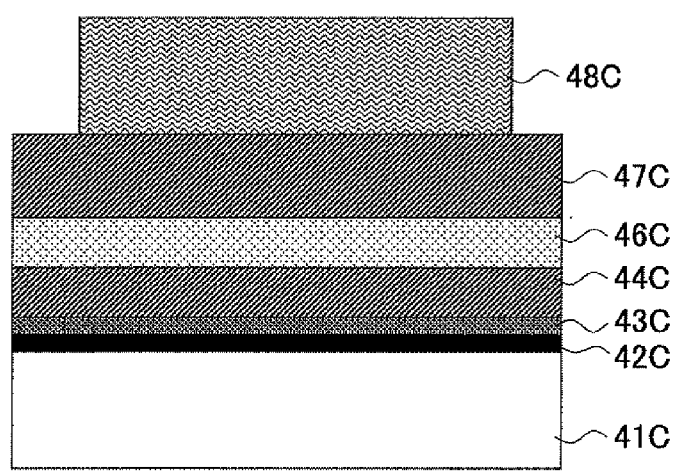

Next, in the process of FIG. 7C, an upper Pt electrode film 47C of approximately 50 nm in thickness is formed on the NiO film 46C of FIG. 7B in the same manner as the upper electrode film 47 (FIG. 3D). Then, as illustrated in FIG. 7D, a resist pattern 48C is formed on the upper electrode film 47C, and the upper electrode film 47C, the NiO film 46C, the lower electrode film 44C, the TiN diffusion barrier film 43C, and the Ti film 42C are patterned by dry etching, using the resist pattern 48C as a mask. As a result, a comparative MIM example 40C illustrated in FIG. 7E is formed.

Figure 7E:
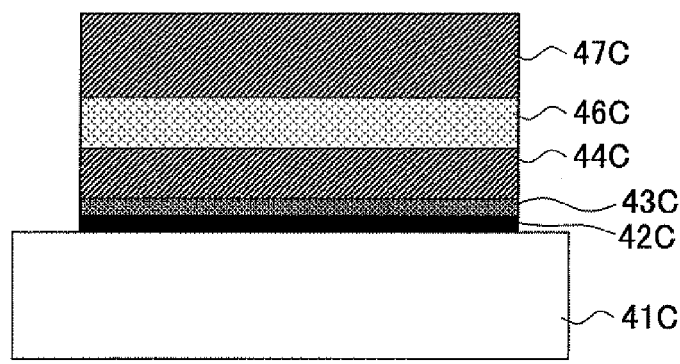

The comparative example in FIG. 4A is also a result on the comparative MIM sample 40C of FIG. 7E.

Referring to FIG. 2, in the case of the comparative MIM sample 40C, where the NiO film 46C (resistive film) is not doped with Ti, when the pulse width t of the voltage $V_{CELL}$ is 50 ns, the resistance $R_{HRS}$ is at or below $10^4\Omega$ in most of the 50 repeated cases of "reset," thus indicating that the resistance of the NiO film 46C hardly changes from $2\times10^3\Omega$, which is the resistance in the low resistance state.

When the pulse width t is increased from 50 ns to 500 ns to 5 μs to 50 μs to 500 μs, the ratio of appearance of higher resistance $R_{HRS}$ values gradually increases. In the comparative example, however, even with the pulse width t of 5 μs, no transition (switching) occurs in a significant proportion of the cases. It is found that it is necessary to use a voltage pulse whose pulse width t is 50 μs in order to ensure transition in all of the 50 cases of "reset."

That is, it is found that in the case of the comparative example using a NiO film that is not doped with Ti as a resistive film, it takes a period of 50 μs to ensure "reset."

On the other hand, referring to FIG. 6, in the case of the resistive (variable resistance) MIM device 40 using the Ti-doped NiO film 46 as a resistive film according to this embodiment, the resistance $R_{HRS}$ is higher than or equal to $10^5\Omega$ with the pulse width t of merely 5 ns in all of the 50 repeated cases of "reset," thus indicating the occurrence of "reset" at extremely high speed. Further, changing the pulse width t to 10 ns to 50 ns does not change the cumulative probability distribution of the resistance $R_{HRS}$. Thus, it has been demonstrated that it is possible to dramatically reduce the "reset" time in the variable resistance MIM device 40 by doping the variable resistance film of NiO (the NiO film 46) with Ti.

It is believed that this is because, as described above, when Ti is diffused into the NiO film 46 toward the upper electrode film 47 from the lower electrode film 44 side in the structure of FIG. 3F, a corresponding increase of oxygen near the lower electrode film 44 is induced to form the oxygen-rich layer 46O adjacent to the Ti-rich layer 46T in contact with the lower electrode film 44 in the NiO film 46, so that at the time of "reset," oxygen ions supplied from the oxygen-rich layer 46O swiftly cut a conductive filament formed of successive defects such as oxygen deficiencies so as to allow the NiO film 46 to switch to the high resistance state at high speed.

Figure 8A:
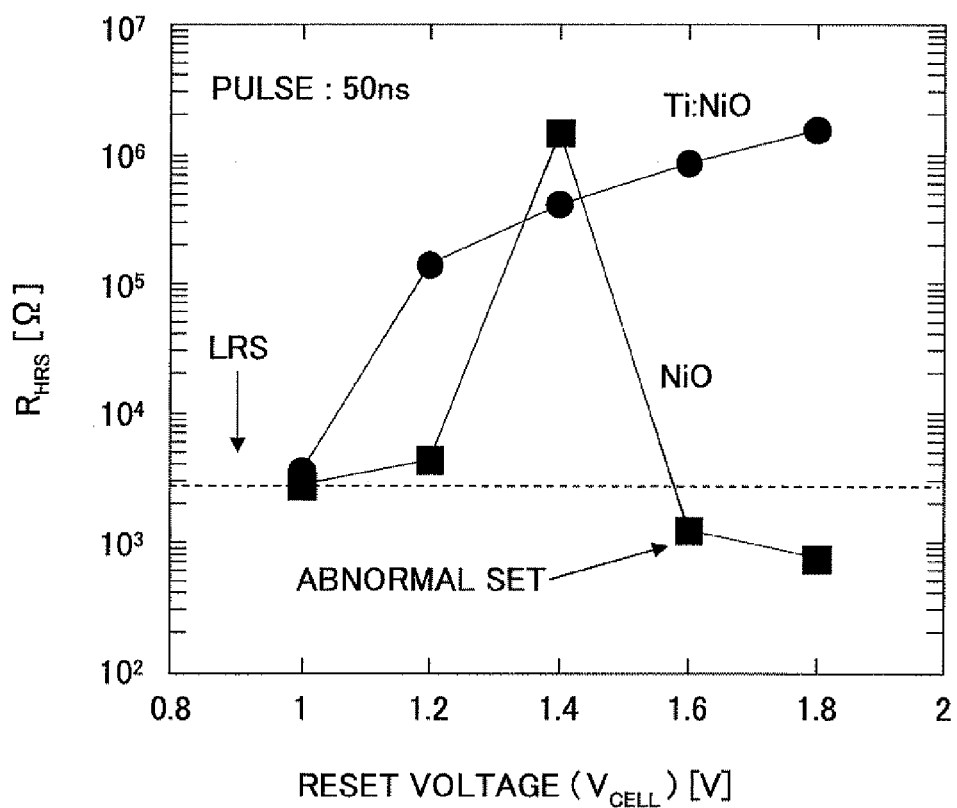
FIG. 8A is a graph comparing the "reset" characteristics of the resistive MIM device according to the comparative example and the resistive MIM device according to the first embodiment.

FIG. 8A illustrates the relationship between the resistance $R_{HRS}$ after a transition from the low resistance state to the high resistance state and the magnitude of the voltage pulse $V_{CELL}$ (Reset Voltage) in the case of changing the magnitude of the voltage pulse $V_{CELL}$ in the comparative MIM sample (comparative standard sample) 40C of FIG. 7E having the characteristics of FIG. 2 and the resistive MIM device 40 of FIG. 3F having the characteristics of FIG. 6 according to this embodiment. In FIG. 8A, the pulse width t of the voltage pulse $V_{CELL}$ is 50 ns.

Figure 8B:
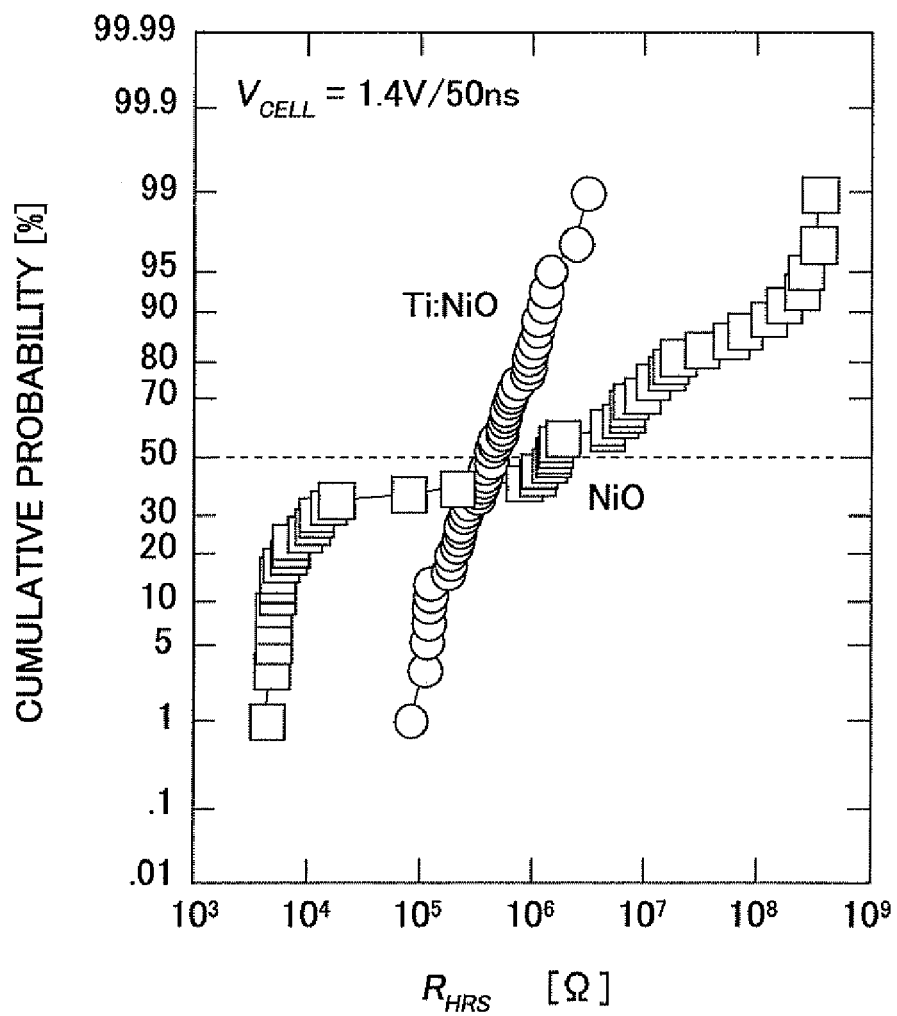
FIG. 8B is another graph comparing the "reset" characteristics of the resistive MIM device according to the comparative example and the resistive MIM device according to the first embodiment.

Referring to FIG. 8A, in the resistive MIM device 40 using the Ti-doped NiO film 46 as a resistive film according to this embodiment, the post-transition resistance $R_{HRS}$ presents a tendency to gradually increase with an increase in the magnitude of the voltage pulse $V_{CELL}$ as indicated by black circles in FIG. 8A. On the other hand, in the case of the comparative MIM sample 40C indicated by black squares in FIG. 8A, when the magnitude of the voltage pulse $V_{CELL}$ starts at and increases from 1 V, the resistance $R_{HRS}$ becomes approximately $10^6\Omega$ at 1.4 V but returns to a value lower than the initial resistance $R_{LRS}$ of the low resistance state when the magnitude of the voltage pulse $V_{CELL}$ exceeds 1.4 V to become 1.6 V. FIG. 8B illustrates in comparison the cumulative probability distribution of the resistance $R_{HRS}$ of the resistive MIM device 40 according to this embodiment and the cumulative probability distribution of the resistance $R_{HRS}$ of the comparative MIM sample 40C in the case of the magnitude of voltage pulse $V_{CELL}$ being 1.4 V illustrated in FIG. 8A. The graph of FIG. 8A actually illustrates changes in the medians of the resistance $R_{HRS}$ in the cumulative probability distributions as illustrated in FIG. 8B.

It is believed that the phenomenon seen at a voltage pulse magnitude of 1.6 V in the comparative example is due to the occurrence of unintended "set," that is, abnormal "set," caused by application of voltage that has been distributed to the transistor Tr and its interconnection patterns to the NiO film 46C of the comparative MIM sample 40C at the instant when the resistance of the NiO film 46C switches from $R_{LRS}$ to $R_{HRS}$ because of "reset." Further, as illustrated in FIG. 8B, even in the case of using a voltage of 1.4 V that does not cause such abnormal "set" for the voltage pulse $V_{CELL}$, the success rate of "reset" is more or less 50%, that is, "reset" is successful approximately 25 times out of 50. This indicates the unstableness of the "reset" operation in the comparative example. Therefore, in the comparative MIM sample 40C according to the comparative example of the present invention, which uses a normal NiO film without Ti doping (the NiO film 46C) as a resistive film, it is necessary to use a low voltage as the voltage pulse $V_{CELL}$ for the "reset" operation in order to prevent "reset" from being unstable. However, with the voltage pulse $V_{CELL}$ of such a low voltage, it takes a longer period of time before the completion of "reset."

On the other hand, in the resistive MIM device 40 using the Ti-doped NiO film 46 as a variable resistance film as illustrated in FIG. 3F according to this embodiment, as is seen from FIG. 8A, it is possible to perform "reset" with stability without occurrence of abnormal "set" even when the magnitude of the voltage pulse $V_{CELL}$ at the time of "reset" is increased up to 1.8 V. Further, it is possible to perform "reset" at high speed by using a high voltage for the voltage pulse $V_{CELL}$ at the time of "reset."

According to this embodiment, it is desirable to dope the NiO variable resistance film 46 with Ti with efficiency. Accordingly, the inventor of the present invention has studied an optimum film thickness for the Ti film 45 used in the process of FIG. 3B.

According to this study, MIM test pieces 40A having the same structure as the variable resistance MIM device 40 illustrated in FIG. 3F were made in the process of FIGS. 9A through 9F corresponding to FIGS. 3A through 3F.

Figure 9A:
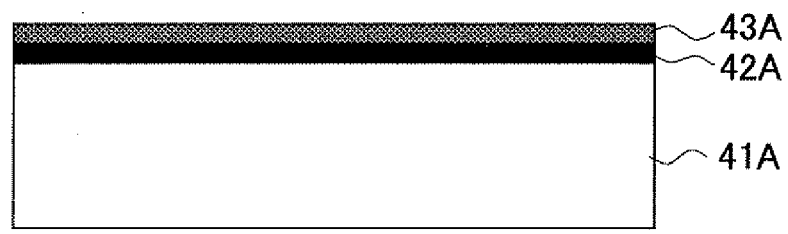
FIGS. 9A through 9F are diagrams illustrating a process for making samples used in an experiment for determining an optimum dopant film thickness according to the first embodiment.

Referring to FIG. 9A, a titanium adhesion film 42A of 10 nm in thickness and a titanium nitride (TiN) diffusion barrier film 43A of 100 nm in thickness corresponding to the Ti adhesion film 42 and the TiN diffusion barrier film 43 (FIG. 3A), respectively, are successively formed on an insulating film 41A, which corresponds to the insulating film 41 (FIG. 3A), by sputtering. Here, the TiN diffusion barrier film 43A also serves as a lower electrode.

Figure 9B:
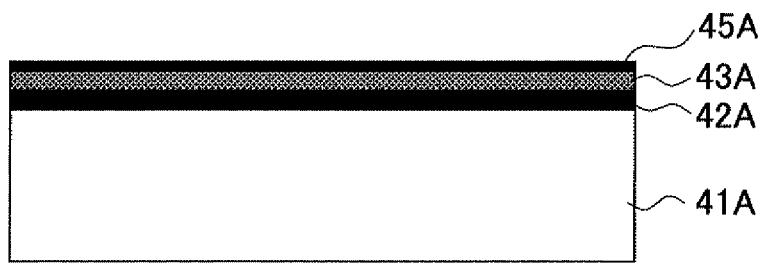

Next, in the process of FIG. 9B corresponding to the process of FIG. 3B, a Pt film 45A, which is extremely thin when formed, is formed to be 0 nm (no Pt film formation), 1 nm, 2 nm, and 5 nm in thickness on the TiN lower electrode film (TiN diffusion barrier film) 43A of FIG. 9A by sputtering using Pt as a target.

Figure 9C:
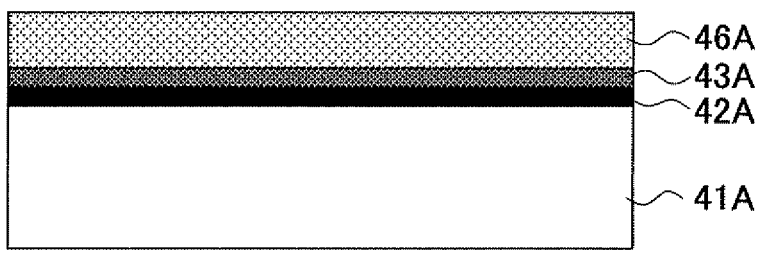

Next, in the process of FIG. 9C corresponding to the process of FIG. 3C, like the NiO film 46, a nickel oxide (NiO) film 46A of 5 nm to 10 nm in thickness is formed on the Pt film 45A of FIG. 9B at a substrate temperature of 380° C. by reactive sputtering using Ni as a target.

Figure 9D:
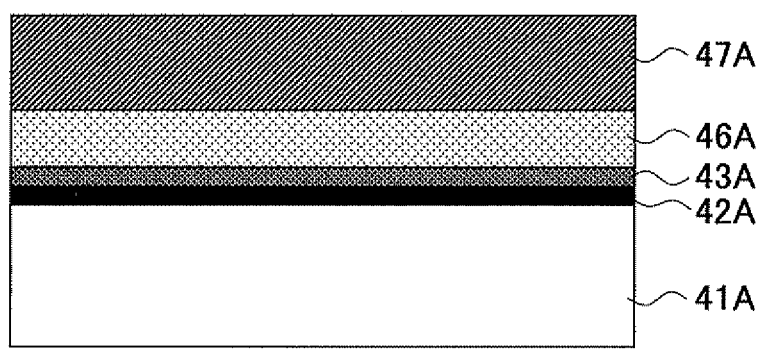
Figure 9E:
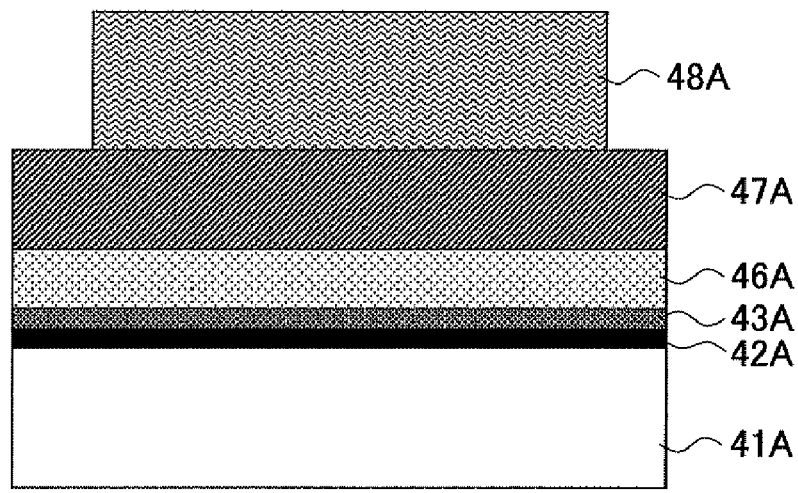

Next, referring to FIG. 9D, a Pt upper electrode film 47A of approximately 50 nm in thickness is formed on the NiO film 46A of FIG. 9C in the same manner as the upper electrode film 47. Then, as illustrated in FIG. 9E, a resist pattern 48A is formed on the upper electrode film 47A, and the upper electrode film 47A, the NiO film 46A, the TiN lower electrode film 43A, and the Ti film 42A are patterned by dry etching, using the resist pattern 48A as a mask. As a result, the MIM test piece 40A illustrated in FIG. 9F is formed.

Thus, in the experiment using the test pieces 40A (FIG. 9F), in the process of FIG. 9B, the Pt film 45A is formed in place of the Ti film 45 used in the process of FIG. 3B to be 0 nm (no Pt film formation), 1 nm, 2 nm, and 5 nm in thickness, and the resistance of the Pt-doped NiO film 46A corresponding to the Ti-doped NiO film 46 was measured in the obtained MIM test pieces 40A. In this experiment, the Pt film 45A was used in place of the Ti film 45 because it is easier to determine the degree of doping of Pt atoms into the NiO film 46A by the measurement of resistance in the case of using the Pt film 45A.

Figure 9F:
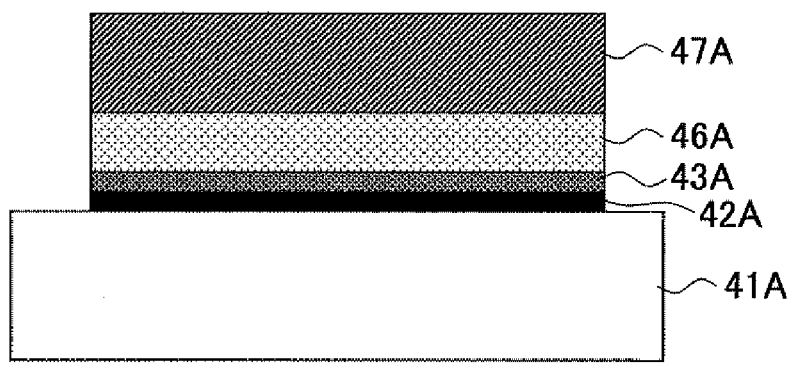
Figure 10:
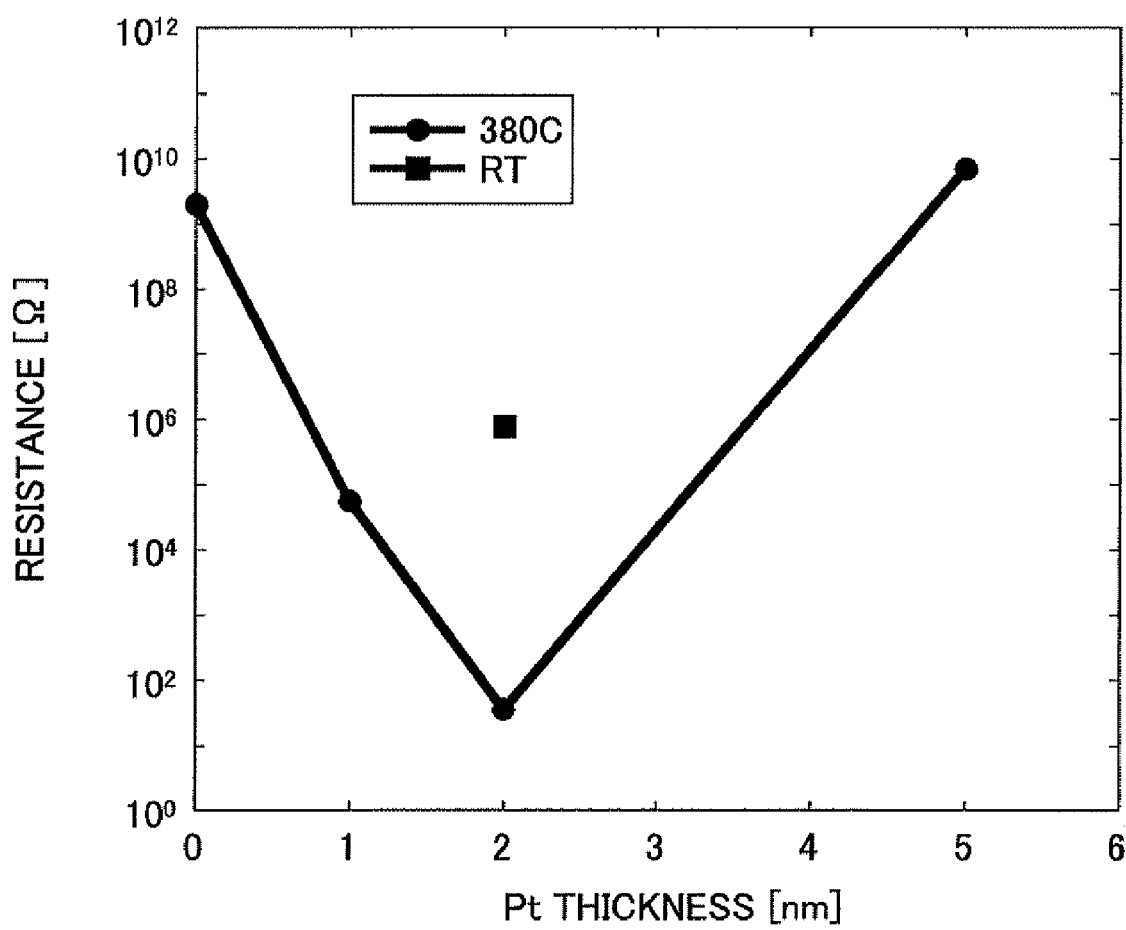
FIG. 10 is a graph illustrating the optimum dopant film thickness according to the first embodiment.

FIG. 10 illustrates the results of the measurement of the resistance of the NiO film 46A in the test pieces 40A (FIG. 9F).

Referring to FIG. 10, while the resistance of the NiO film 46A is approximately $10^9 \Omega$ in the case of not forming the Pt film 45A in the process of FIG. 9B, the resistance of the NiO film 46A is reduced to $10^5 \Omega$ in the case of forming the Pt film 45A of 1 nm in thickness in place of the Ti film 45. This indicates that the NiO film 46A is doped with a substantial amount of Pt.

Further, in the case of the Pt film 45A of 2 nm in thickness, the resistance of the NiO film 46A is reduced to be at or below $10^2 \Omega$, illustrating that the NiO film 46A is doped with Pt very effectively. In particular, in the case of the Pt film 45A of 2 nm in thickness, the resistance of the NiO film 46A in the case of forming the NiO film 46A at room temperature (RT) is also indicated. In such a case, the resistance of the NiO film 46A is $10^6 \Omega$. This illustrates that Pt is diffused very effectively into the NiO film 46A from the Pt film 45A in the case of forming the NiO film 46A at a substrate temperature of 380° C. with the Pt film 45A being 2 nm in thickness.

On the other hand, when the thickness of the Pt film 45A is further increased, the resistance of the NiO film 46A starts to increase. FIG. 10 illustrates that in the case of forming the Pt film 45A of 5 nm in thickness in the process of FIG. 9B, for example, the resistance of the NiO film 46A exceeds $10^{10} \Omega$.

The results of FIG. 10 illustrate that in the case of doping the NiO film 46A with Pt atoms from the underlying Pt film 45A, the thickness of the Pt film 45A is preferably more than or equal to 1 nm and less than or equal to 3 nm, and is preferably 2 nm in particular. The results of FIG. 10 also illustrate that the thickness of the Ti film 45 is preferably more than or equal to 1 nm and less than or equal to 3 nm, and is preferably 2 nm in particular, also in the case of doping the NiO film 46 with Ti atoms from the underlying Ti film 45 in the process of FIG. 3C.

Thus, as illustrated in, for example, FIGS. 3C and 3D, in a resistive random access memory of an MIM structure using the NiO film 46 having its lower portion doped efficiently with Ti atoms as a resistive film, the Ti-rich layer 46T is formed in a lower region of the NiO film 46, and the oxygen-rich layer 46O is formed on the Ti-rich layer 46T, that is, on the upper electrode film 47 side of the Ti-rich layer 46T to be adjacent to the Ti-rich layer 46T. Therefore, an effective non-volatile memory is obtained where a "reset" operation is performed at high speed in response to application of the voltage $V_{RESET}$ illustrated in FIG. 1B or FIG. 5A to the above-described structure.

Figure 11A:
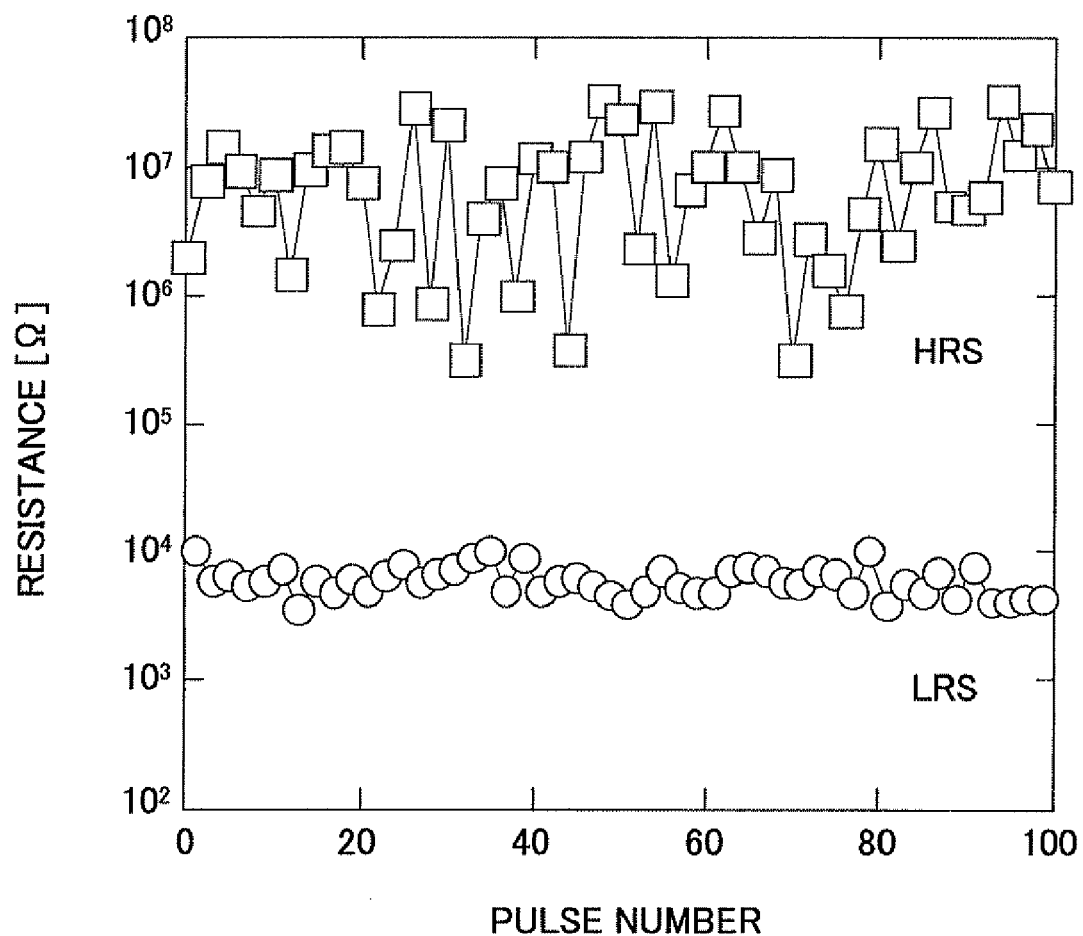
FIG. 11A is a graph illustrating variations in the resistances of a resistive MIM film of the comparative example in a "set" state and a "reset" state according to the first embodiment.

FIG. 11A illustrates the resistances of the NiO film 46C in the low resistance state and in the high resistance state in the case of repeating "set" and "reset" 50 times each, that is, 100 times in total, with respect to the comparative MIM sample 40C illustrated in FIG. 7E under the operating conditions illustrated in FIG. 11A. Further, FIG. 11B illustrates the resistances of the NiO film 46 in the low resistance state and in the high resistance state in the case of repeating "set" and "reset" 50 times each, that is, 100 times in total, with respect to the resistive MIM device 40 illustrated in FIG. 3F under the operating conditions illustrated in FIG. 11B.

Figure 11B:
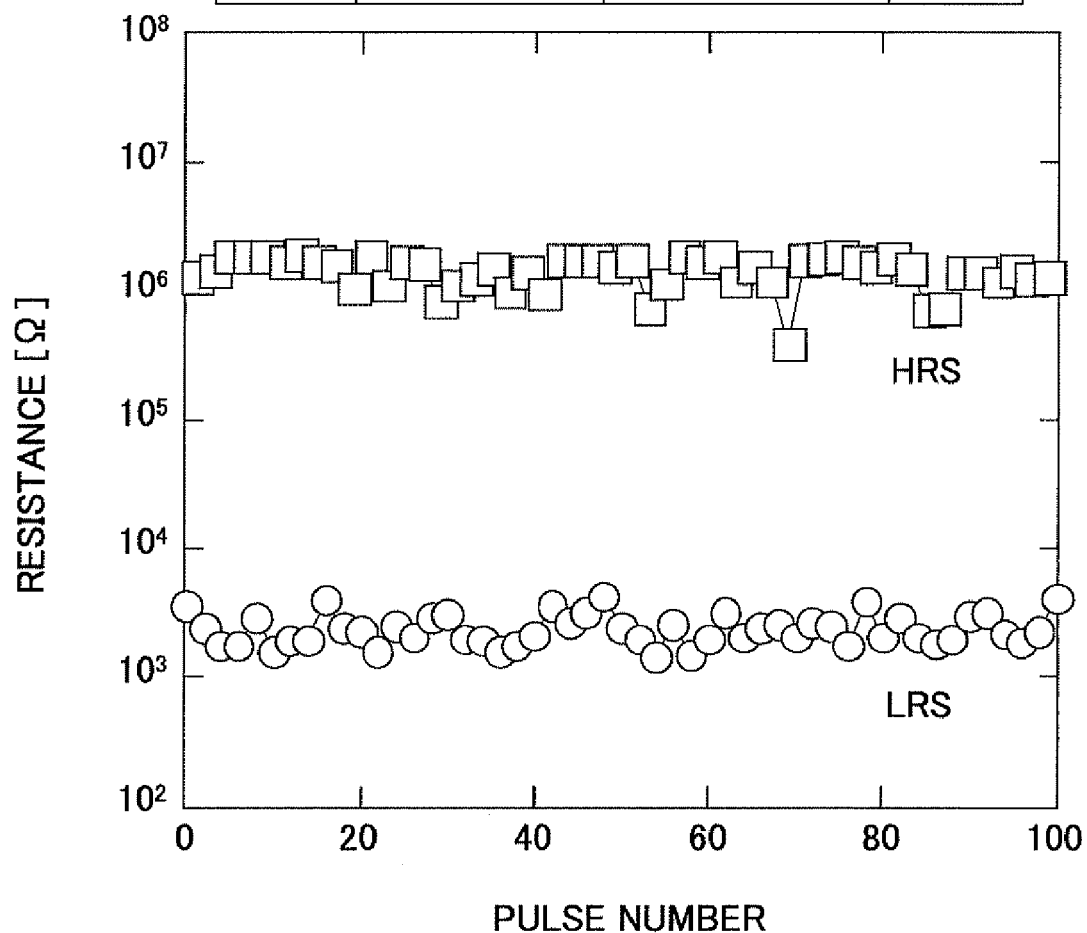
FIG. 11B is a graph illustrating variations in the resistances of the resistive MIM film in a "set" state and a "reset" state according to the first embodiment.

Referring to FIGS. 11A and 11B, in the comparative MIM sample 40C illustrated in FIG. 11A, the "reset" operation is performed at a reset pulse voltage $V_{RESET}$ of 1 V with a reset pulse width t of 500 µs, and it is found that the resistance in the high resistance state varies by one order of magnitude or more.

On the other hand, in the resistive MIM device 40 illustrated in FIG. 11B, the "reset" operation is performed at a reset pulse voltage $V_{RESET}$ of 1.8 V with a reset pulse width t of 50 ns, and it is found that the resistance in the high resistance state hardly varies and extremely high-speed "reset" is achieved.

As a variation of this embodiment, it is also possible to employ the following process and structure.

FIGS. 12A through 12D are diagrams for illustrating the variation of this embodiment. In FIGS. 12A through 12D, the same elements as those illustrated in FIGS. 3A through 3D are referred to by the same reference numerals.

Figure 12A:
FIGS. 12A through 12D are diagrams illustrating a process for manufacturing the resistive MIM device according to a variation of the first embodiment.

Referring to FIG. 12A, the Ti adhesion film 42 of 10 nm in thickness and the TiN diffusion barrier film 43 of 100 nm in thickness, which also serves as a lower electrode film, are successive formed on the insulating film 41 by sputtering. For example, the Ti adhesion film 42 may be formed by inputting plasma power of 1 kW at a substrate temperature of 50° C. in an argon (Ar) atmosphere of 0.5 Pa by sputtering using Ti as a target. Further, the TiN diffusion barrier film (lower electrode film) 43 may be formed by inputting plasma power of 2 kW at a substrate temperature of 300° C. in an argon/nitrogen (Ar/$N_2$) atmosphere containing Ar gas at a partial pressure of 0.25 Pa and $N_2$ gas at a partial pressure of 0.25 Pa by reactive sputtering using Ti as a target.

Figure 12B:

Next, in the process of FIG. 12B, which substitutes for the process of FIG. 3B, an extremely thin oxygen-rich nickel oxide (NiO) film 145 of 3 nm to 10 nm in thickness is formed on the TiN diffusion barrier film (lower electrode film) 43 of FIG. 12A by inputting plasma power of 1 kW at a substrate temperature of 50° C. in an argon/oxygen (Ar/$O_2$) atmosphere containing Ar gas at a partial pressure of 0.40 Pa and $O_2$ gas at a partial pressure of 0.10 Pa by reactive sputtering using Ni as a target.

Figure 12C:
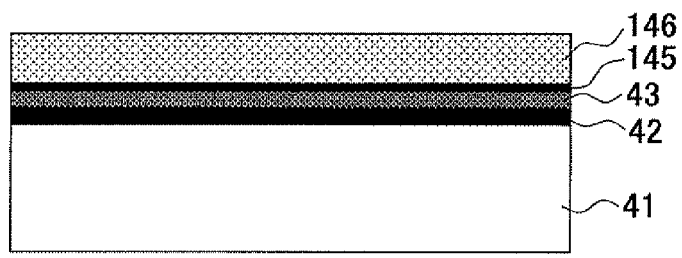

Next, in the process of FIG. 12C, which substitutes for the process of FIG. 3C, a nickel oxide (NiO) film 146 close to or richer in nickel than the stoichiometric composition is formed to be 5 nm to 15 nm in thickness on the oxygen-rich NiO film 145 by inputting plasma power of 1 kW at a substrate temperature of 380° C. in an argon/oxygen (Ar/$O_2$) atmosphere containing Ar gas at a partial pressure of 0.47 Pa and $O_2$ gas at a partial pressure of 0.03 Pa by reactive sputtering using Ni as a target.

Figure 12D:
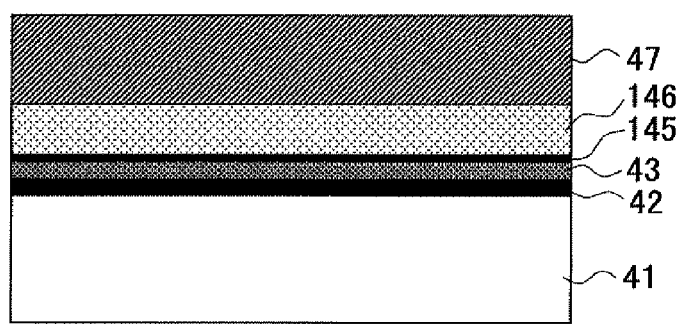

Further, in the process of FIG. 12D, the upper electrode film 47 is formed on the NiO film 146.

By this method, it is possible to form an oxygen-rich portion and a Ni-rich portion in the NiO film forming the variable resistance MIM device, so that it is possible to obtain a variable resistance MIM device without variations in characteristics as illustrated above in FIG. 6.

[b] Second Embodiment

Figure 13A:
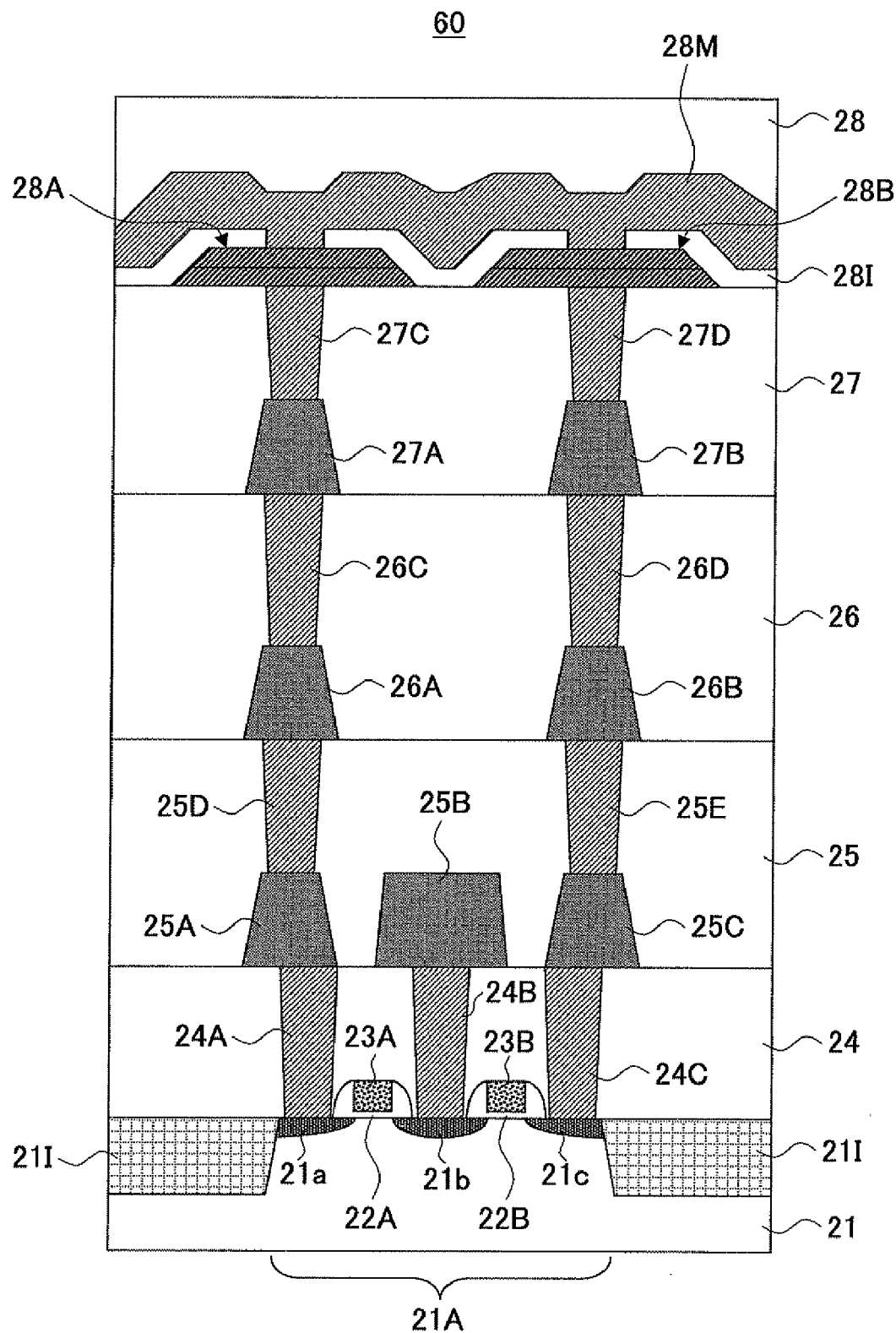
FIG. 13A is a diagram illustrating a configuration of a nonvolatile memory according to a second embodiment.
Figure 13B:
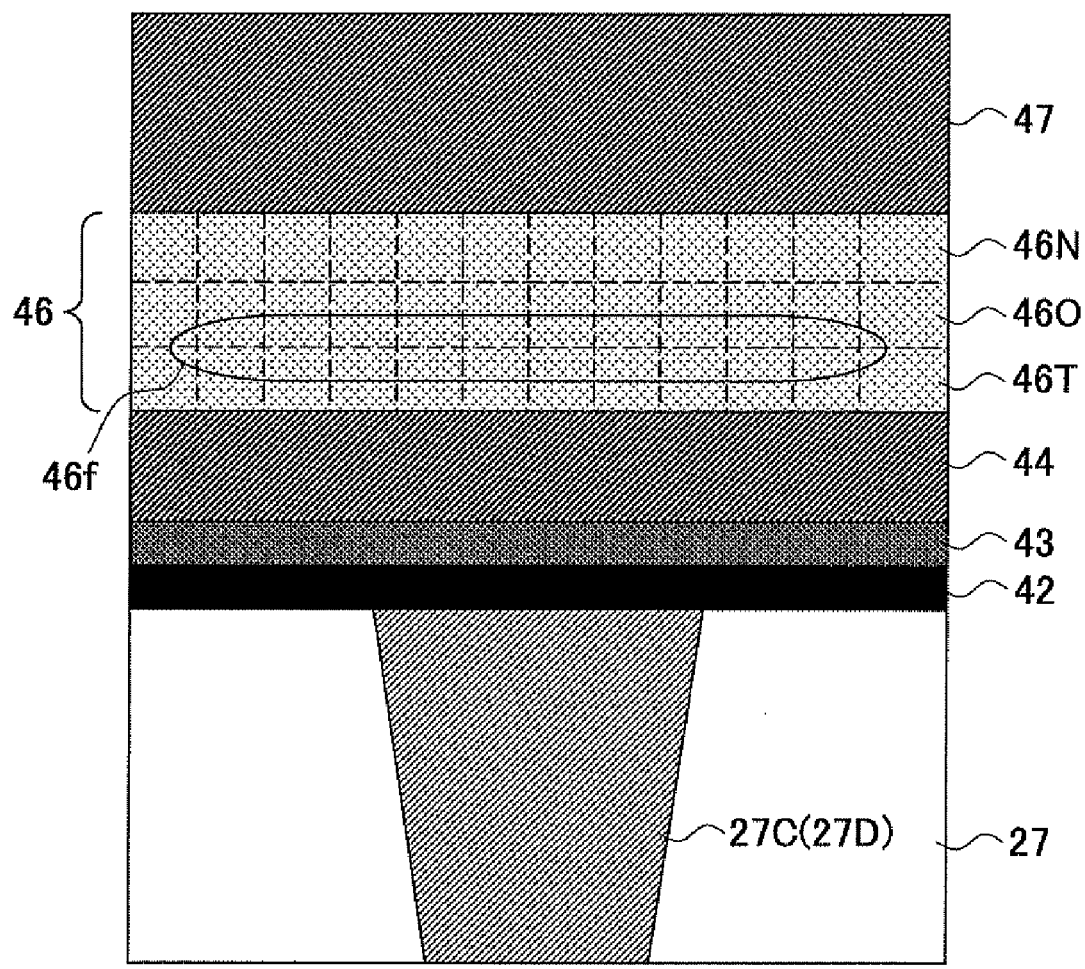
FIG. 13B is a diagram illustrating in detail a variable resistance MIM device in the nonvolatile memory of FIG. 13A according to the second embodiment.

FIGS. 13A and 13B are diagrams illustrating a nonvolatile semiconductor memory 60 using the above-described resistive MIM device 40 according to a second embodiment.

Referring to FIG. 13A, a device region 21A is defined at the surface of a silicon substrate 21 by an isolation region 21I. In the device region 21A, a gate insulating film 22A and a gate insulating film 22B are formed on the silicon substrate 21, and a gate electrode 23A and a gate electrode 23B are formed on the gate insulating film 22A and the gate insulating film 22B, respectively. Further, in the device region 21A, diffusion regions 21a, 21b, and 21c are formed in the silicon substrate 21 to be adjacent to the gate electrodes 23A and 23B. The gate electrodes 23A and 23B are covered with respective sidewall insulating films.

An insulating film 24 is formed on the silicon substrate 21 so as to cover the gate electrodes 23A and 23B. Contact plugs 24A, 24B, and 24C are formed in the insulating film 24 to be in contact with the diffusion regions 21a, 21b, and 21c, respectively.

First-layer metal interconnection patterns 25A, 25B, and 25C are formed on the insulating film 24 to be in contact with the contact plugs 24A, 24B, and 24C, respectively. The first-layer metal interconnection patterns 25A, 25B, and 25C are covered with an interlayer insulating film 25. Further, via plugs 25D and 25E are formed in the interlayer insulating film 25 to be in contact with the interconnection patterns 25A and 25C, respectively.

Second-layer metal interconnection patterns 26A and 26B are formed on the interlayer insulating film 25 to be in contact with the via plugs 25D and 25E, respectively. Another interlayer insulating film 26 is formed on the interlayer insulating film 25 so as to cover the metal interconnection patterns 26A and 26B. Via plugs 26C and 26D are formed in the interlayer insulating film 26 to be in contact with the interconnection patterns 26A and 26B, respectively.

Third-layer metal interconnection patterns 27A and 27B are formed on the interlayer insulating film 26 to be in contact with the via plugs 26C and 26D, respectively. Another interlayer insulating film 27 is formed on the interlayer insulating film 26 so as to cover the metal interconnection patterns 27A and 27B. Via plugs 27C and 27D are formed in the interlayer insulating film 27 to be in contact with the interconnection patterns 27A and 27B, respectively.

Further, resistive MIM devices 28A and 28B as illustrated in FIG. 13B are formed on the interlayer insulating film 27 to be in contact with the via plugs 27C and 27D. The resistive MIM devices 28A and 28B are connected by a bit line pattern 28M through an insulating film 28I.

Further, the resistive MIM devices 28A and 28B as well as the bit line pattern 28M are covered with an interlayer insulating film 28.

FIG. 13B is a diagram illustrating a configuration of the resistive MIM devices 28A and 28B in detail. In FIG. 13B, parts or elements corresponding to those described above are referred to by the same reference numerals.

Referring to FIG. 13B, each of the resistive MIM devices 28A and 28B has the same configuration as the resistive MIM device 40 of FIG. 3F, where the NiO resistive film 46 is held between the lower Pt electrode film 44 and the upper Pt electrode film 47.

The lower Pt electrode film 44 is stacked over the interlayer insulating film 27 with the Ti adhesion film 42 and the TiN diffusion barrier film 43 interposed between the lower Pt electrode film 44 and the interlayer insulating film 27. The via plug 27C (in the case of the resistive MIM device 28A) or 27D (in the case of the resistive MIM device 28B) is electrically connected to the lower Pt electrode film 44 through the Ti adhesion film 42 and the TiN diffusion barrier film 43. Further, the upper Pt electrode film 47 is connected to the bit line pattern 28M through a contact hole formed in the insulating film 28I (FIG. 13A).

As a result of forming, a conductive filament 46f is formed in the NiO film 46. Further, in the NiO film 46, an element distribution profile with respect to Ni, Pt, O, and Ti atoms as illustrated in FIG. 4B is generated in the depth directions by the doping of Ti from the lower Pt electrode film 44 side. The Ti-rich layer 46T is formed directly on the lower Pt electrode film 44. The Ni-rich layer 46N is formed immediately under the upper Pt electrode film 47. The oxygen-rich layer 46O is formed between the Ti-rich layer 46T and the Ni-rich layer 46N. As is seen from the element distribution profile of FIG. 4B, the boundary between the Ti-rich layer 46T and the oxygen-rich layer 46O and the boundary between the oxygen-rich layer 46O and the Ni-rich layer 46N are not clearly defined, and the transition from one layer to another is gradual.

In the resistive MIM devices 28A and 28B having such a configuration, when a transistor having the gate electrode 23A (in the case of the resistive MIM device 28A) or 23B (in the case of the resistive MIM device 28B) is turned ON, the set voltage $V_{SET}$ or the reset voltage $V_{RESET}$ is applied between the upper electrode film 47 and the lower electrode film 44. As a result, the NiO film 46 switches from the high resistance state to the low resistance state or from the low resistance state to the high resistance state, and thus the nonvolatile semiconductor memory 60 of FIG. 13A performs a nonvolatile operation.

At this point, in the resistive MIM devices 28A and 28B, while the "set" from the high resistance state to the low resistance state occurs at high speed the same as in other common resistive devices, the "reset" from the low resistance state to the high resistance state occurs at extremely high speed as a result of using a MIM device structure according to an embodiment of the present invention. Further, it is possible to use as high a voltage as approximately 1.8 V as a reset voltage pulse at the time of a "reset" operation. This further increases "reset" speed. Further, since the variation of resistance in the high resistance state is limited, data are read with high accuracy and the nonvolatile semiconductor memory 60 is prevented from malfunctioning.

In the process of FIG. 3B, the Ti film 45 is used as a dopant film. However, Ti is not the sole element that interacts with Ni atoms in the NiO film 46 to generate such an element distribution profile as illustrated in FIG. 4B. Elements (M) whose Gibbs free energy changes $\Delta G$ at the time of bonding to oxygen by the reaction $M+O_2 \rightarrow MO_2$ to generate an oxide are large may be used. Examples of such elements include Ta, Hf, Zr, Al, W, and Si in addition to Ti. It is also possible to dope the NiO film 46 with two or more of these elements at the same time.

Further, the resistive film is not limited to the NiO film 46, and other materials whose resistances have been found to be variable, such as $TiO_2$, $HfO_2$, $ZrO_2$, $Al_2O_3$, $WO_3$, CuO, $Cu_2O$, and CoO, may also be used.

Further, the material of the lower electrode film 44 and the upper electrode film 47 is not limited to Pt, and materials such as Ru, Ir, ruthenium oxide, iridium oxide, W, Cu, Ta, and titanium nitride may also be used.

According to one aspect of the present invention, a metal oxide film includes another element with such a depth profile that the other element has a peak near the interface (with a lower electrode). Consequently, as a result of the strong affinity of oxygen to the other element, more precisely, as a result of the Gibbs free energy change $\Delta G$ in the reaction $M+O_2 \rightarrow MO_2$, where M represents the other element, taking a large negative value, oxygen moves to a position close to the position of the peak from a shallower position, that is, a region close to an upper electrode in the metal oxide film, so that a region of oxygen concentration is generated at a position slightly shallower than the position of the peak, that is, a position slightly closer to the upper electrode than is the position of the peak. Further, the diffusion of the metal of the metal oxide in the direction of the peak of the other element promotes the concentration of oxygen in the oxygen concentration region. Further, the introduction of the other element into the metal oxide film disturbs the bond of the metal element and oxygen of the metal oxide in the metal oxide film, so that various metal element-oxygen bonding conditions with different binding energy levels are generated.

It is believed that when a reset voltage $V_{RESET}$ is applied to the metal oxide film in such a condition, oxygen ions are swiftly supplied from the oxygen concentration region to the anode-side region of a conductive filament through a path where the binding energy of the metal element and oxygen is low, so that the conductive filament is swiftly cut off. Further, the high resistance state thus generated is stably retained, so that even if the voltage applied between the lower electrode and the upper electrode for "reset" slightly exceeds the reset voltage $V_{RESET}$, no unintended "set" is caused.

Therefore, according to one aspect of the present invention, it is possible to use a high voltage at the time of "reset," and it is possible to further increase "reset" speed controlled primarily by the supply limitation of oxygen.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A resistive random access memory, comprising:
   a lower electrode;
   a metal oxide film formed on the lower electrode and having a variable resistance, the metal oxide film having a first portion containing a metal element forming the metal oxide film and a second portion richer in oxygen than the first portion; and
   an upper electrode formed on the metal oxide film,
   wherein the first portion is formed between the second portion and the upper electrode.

2. The resistive random access memory as claimed in claim 1, wherein the metal oxide film contains an additional metal element between the second portion and the lower electrode, the additional metal element being different from the metal element forming the metal oxide film.

3. The resistive random access memory as claimed in claim 2, wherein:
   the additional metal element is different from a metal element forming the lower electrode, and
   the additional metal element is contained with such a depth profile as to have a peak near an interface between the lower electrode and the metal oxide film.

4. The resistive random access memory as claimed in claim 3, wherein the second portion is closer to the upper electrode than is the peak of the additional metal element.

5. The resistive random access memory as claimed in claim 2, wherein the additional metal element is greater in a magnitude of a Gibbs free energy change at a time of bonding to oxygen to form a metal oxide than the metal element forming the metal oxide film.

6. The resistive random access memory as claimed in claim 2, wherein:
   the metal oxide film is a NiO film, and
   the additional metal element is selected from the group consisting of Ti, Ta, Hf, Zr, Al, W, and Si.

7. The resistive random access memory as claimed in claim 1, wherein the metal oxide film comprises one of NiO, $TiO_2$, $HfO_2$, $ZrO_2$, $Al_2O_3$, $WO_3$, CuO, $Cu_2O$, and CoO.

8. The resistive random access memory as claimed in claim 1, wherein the lower electrode and the upper electrode comprise one of Pt, Ru, Ir, ruthenium oxide, iridium oxide, W, Cu, Ta, and titanium nitride.

9. A nonvolatile memory, comprising:
   a substrate;
   a transistor formed on the substrate;
   an insulating film formed on the substrate so as to cover the transistor; and a resistive random access memory formed on the insulating film so as to be connected to the transistor, wherein the resistive random access memory is the resistive random access memory as set forth in claim 1.

10. A resistive random access memory, comprising:

a lower electrode;

a nickel oxide film formed on the lower electrode and having a variable resistance, the nickel oxide film containing titanium with such a depth profile so that the titanium has a peak near an interface between the lower electrode and the nickel oxide film; and an upper electrode formed on the nickel oxide film.

11. The resistive random access memory as claimed in claim 10, wherein an oxygen concentration is higher in a first portion than in a second portion in the nickel oxide film, the first portion being closer to the upper electrode than is the peak of the titanium, the second portion being immediately under the upper electrode.

12. A nonvolatile memory, comprising:

a substrate;

a transistor formed on the substrate;

an insulating film formed on the substrate so as to cover the transistor; and a resistive random access memory formed on the insulating film so as to be connected to the transistor, wherein the resistive random access memory is the resistive random access memory as set forth in claim 10.

13. A method of manufacturing a resistive random access memory, comprising:

forming a lower electrode;

forming a metal oxide film on the lower electrode; and forming an upper electrode on the metal oxide film, wherein said step of forming the metal oxide film includes forming a first portion containing a metal element forming the metal oxide film; and forming a second portion richer in oxygen than the first portion, so that the first portion is formed between the second portion and the upper electrode.

14. The method as claimed in claim 13, wherein:

said forming the metal oxide film further includes forming a dopant film on the lower electrode, the dopant film being formed of a metal element different from a metal element forming the lower electrode, and the metal oxide film is formed on the lower electrode so as to cover the dopant film.

15. The method as claimed in claim 14, wherein the dopant film is 1 nm to 3 nm in thickness.

16. The method as claimed in claim 14, wherein the different metal element is greater in a magnitude of a Gibbs free energy change at a time of bonding to oxygen to form a metal oxide than the metal element forming the metal oxide film.

17. The method as claimed in claim 14, wherein said forming the metal oxide film diffuses the different metal element so that the different metal element has a peak near an interface between the lower electrode and the metal oxide film.

18. The method as claimed in claim 14, wherein:

the metal oxide film is a NiO film, and the different metal element is selected from the group consisting of Ti, Ta, Hf, Zr, Al, W, and Si.

19. The method as claimed in claim 13, wherein the metal oxide film comprises one of NiO, $TiO_2$, $HfO_2$, $ZrO_2$, $Al_2O_3$, $WO_3$, CuO, $Cu_2O$, and CoO.

20. The method as claimed in claim 13, wherein the second portion is formed with a larger amount of oxygen supply than the first portion.

* * * * *